(12) United States Patent
Tsuchi et al.

(10) Patent No.: US 10,777,119 B2
(45) Date of Patent: *Sep. 15, 2020

(54) SEMICONDUCTOR DEVICE

(71) Applicant: LAPIS Semiconductor Co., Ltd., Yokohama (JP)

(72) Inventors: Hiroshi Tsuchi, Yokohama (JP); Manabu Nishimizu, Oita (JP); Yuushi Syutou, Oita (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 11 days.

This patent is subject to a terminal disclaimer.

(21) Appl. No.: 16/368,485

(22) Filed: Mar. 28, 2019

(65) Prior Publication Data

US 2019/0221153 A1 Jul. 18, 2019

Related U.S. Application Data

(63) Continuation of application No. 15/442,107, filed on Feb. 24, 2017, now Pat. No. 10,262,575.

(30) Foreign Application Priority Data

Feb. 26, 2016 (JP) .................................. 2016-35475

(51) Int. Cl.
*G09G 3/20* (2006.01)
*G09G 3/36* (2006.01)
*G11C 19/00* (2006.01)
*H03K 19/0175* (2006.01)

(52) U.S. Cl.
CPC ......... *G09G 3/2092* (2013.01); *G09G 3/3696* (2013.01); *G11C 19/00* (2013.01); *H03K 19/017509* (2013.01); *G09G 2310/0286* (2013.01); *G09G 2310/0289* (2013.01); *G09G 2310/0291* (2013.01); *G09G 2310/08* (2013.01); *G09G 2330/028* (2013.01)

(58) Field of Classification Search
CPC ............... G09G 3/2092; G09G 3/3696; G09G 2310/0286; G09G 2310/0289; G09G 2310/0291; G09G 2310/08; G09G 2330/028; G11A 19/00; H03K 19/017509
See application file for complete search history.

(56) References Cited

U.S. PATENT DOCUMENTS

| 7,102,436 | B2* | 9/2006 | Sung ...................... H03F 3/3022 330/255 |
| 2003/0128067 | A1* | 7/2003 | Jaussi ...................... G06G 7/16 327/552 |
| 2005/0146493 | A1* | 7/2005 | Kinjo ................... G09G 3/3611 345/89 |

(Continued)

FOREIGN PATENT DOCUMENTS

JP 2014-078804 A 5/2014

*Primary Examiner* — Kent W Chang
*Assistant Examiner* — Sujit Shah
(74) *Attorney, Agent, or Firm* — Rabin & Berdo, P.C.

(57) ABSTRACT

A current corresponding to the difference between an input signal voltage and an output signal voltage is generated as an amplification acceleration current. The amplification acceleration current is sent to an output node of a current mirror, which drives a transistor in an output amplifier stage, and therefore added to a current to drive the transistor in the output amplifier stage.

4 Claims, 18 Drawing Sheets

(56) References Cited

U.S. PATENT DOCUMENTS

| | | | |
|---|---|---|---|
| 2011/0199366 A1* | 8/2011 | Tsuchi | G09G 3/3688 345/212 |
| 2011/0298777 A1* | 12/2011 | Tsuchi | G09G 3/3275 345/211 |
| 2013/0088473 A1* | 4/2013 | Tsuchi | H03F 3/3022 345/211 |
| 2017/0249894 A1* | 8/2017 | Tsuchi | G09G 3/2092 |

* cited by examiner

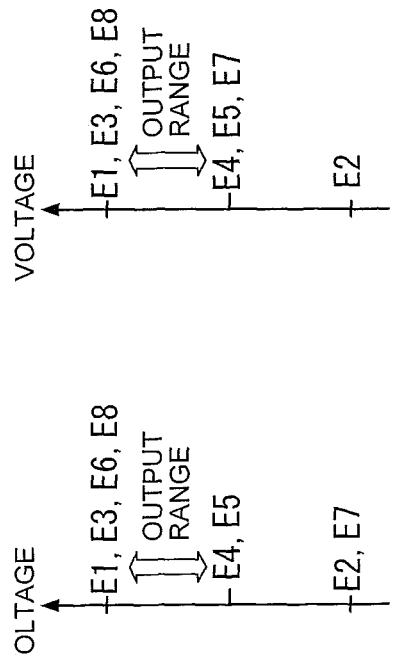
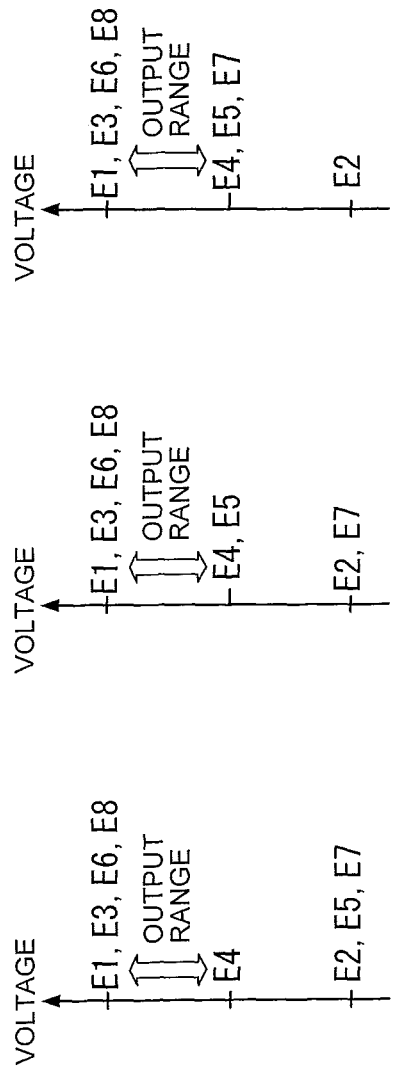
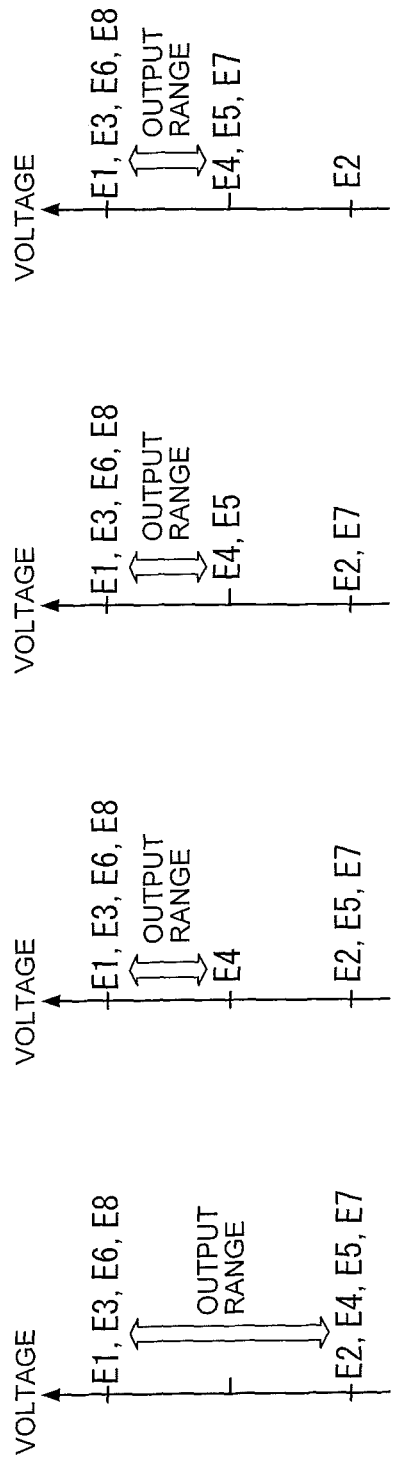
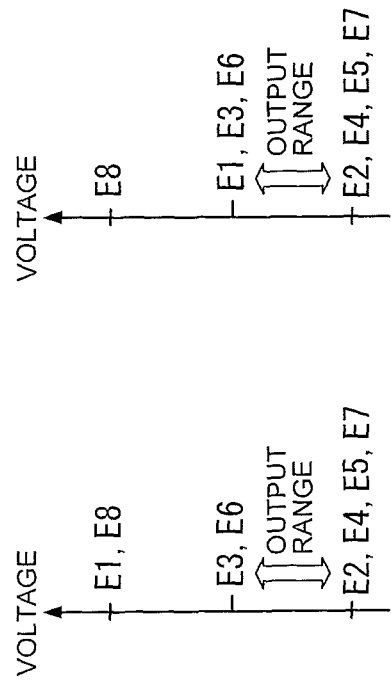
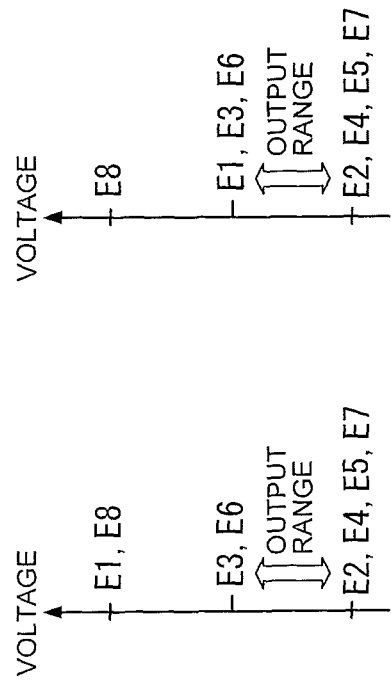
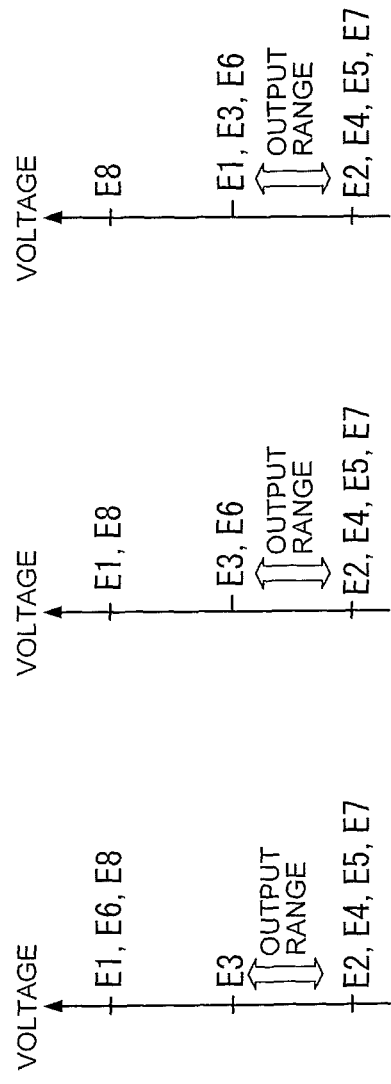

SEMICONDUCTOR DEVICE

CROSS-REFERENCE TO THE RELATED APPLICATIONS

This is a continuation of U.S. application Ser. No. 15/442,107, filed on Feb. 24, 2017, and allowed on Nov. 26, 2018, which claims the benefit of priority from Japanese Patent Application 2016-35475 filed on Feb. 26, 2016. The entire disclosures of these prior U.S. and foreign applications are incorporated herein by reference.

BACKGROUND OF THE INVENTION

1. Field of the Invention

The present invention relates to a semiconductor device, and more specifically, to a semiconductor device including output circuits that output voltage signals for driving loads.

2. Description of the Related Art

Currently, active-matrix liquid crystal displays, organic EL displays, and the like have spread into the mainstream of display devices. Such a display device is equipped with a display panel having a matrix of display cells connected to a plurality of data lines, and a data driver for driving the data lines of the display panel.

Due to increases in the size and resolution of the display panel in recent years, the data driver has to drive increased load capacitances of the data lines of the display panel, and therefore tends to drive the data lines in a short driving period per pixel. The data driver amplifies input signals by charging or discharging the load capacitances of the data lines in accordance with the input signals corresponding to brightness levels represented by a video signal, and supplies the amplified input signals as output signals to the data lines.

Accordingly, an increase in the load capacitances of the data lines and a reduction in the driving period may prevent the amplification operation from following a level change of the input video signal, and cause a delay in the output signals. This may cause deterioration in image quality, such as display unevenness.

Thus, in order to prevent such a malfunction, a data driver in which an amplification accelerator circuit is added to a differential amplifier of an output circuit has been proposed (for example, Japanese Patent Application Laid-Open No. 2014-078804).

The amplification accelerator circuit forcefully increases or decreases the gate potential of each of P-channel and N-channel transistors of an output amplifier stage of the differential amplifier, on the basis of a magnitude comparison result between the average voltage of input signals corresponding to each of a plurality of data lines and the voltage of an output signal actually outputted to the single data line. Therefore, it is possible to reduce time required for a charging and discharging process, thus allowing an increase in an amplification speed of the input signals and an obtainment of the output signal that follows a level change of the input signals.

In the above-described amplification accelerator circuit, a current that corresponds to the difference between the average voltage of the plurality of input signals and the voltage of the output signal is added to a current of an input portion of a current mirror, which constitutes a load circuit of a differential stage of the above-described differential amplifier, in order to vary the gate potential of each of the P-channel and N-channel transistors of the output amplifier stage, so that the current flows through the current mirror circuit into a line connected to the gate of the transistor. However, in a configuration of the differential amplifier having a highly accurate output voltage, the current mirror constituting the load circuit of the differential stage of the differential amplifier is preferably designed so as to have a narrow channel width relative to a channel length, in order to obtain a mirror current with high accuracy. In this case, a response characteristic to variations in the mirror current deteriorates. Therefore, the configuration in which the input portion of the current mirror receives the current of the amplification accelerator circuit causes an increase in time between a level change of the input signals and a reflection of the level change on the gate potential. This impairs a significant increase in the amplification speed, thus causing deterioration in display quality.

SUMMARY OF THE INVENTION

It is an object of the present invention to provide a semiconductor device including output circuits that can output output voltages with high accuracy and perform a high-speed amplification operation that follows a level change of input signals.

A semiconductor device according to one aspect of the present invention is a semiconductor device including an output circuit having a differential input stage, an output amplifier stage, first to Nth (N is a positive integer of 1 or more) input terminals, and an output terminal for outputting an output signal. The semiconductor device includes an amplification accelerator circuit for accelerating an amplification operation of the output amplifier stage. The differential input stage includes: first conductivity-type first to Nth differential stages for generating first to Nth pairs of currents each of which corresponds to a difference between each of first to Nth input signals supplied to the respective first to Nth input terminals and the output signal, and for flowing one of each of the first to Nth pairs of currents into a first common wire and flowing the other of each of the first to Nth pairs of currents into a second common wire; second conductivity-type (N+1)th to (2N)th differential stages for generating (N+1)th to (2N)th pairs of currents each of which corresponds to a difference between each of the first to Nth input signals and the output signal, and flowing one of each of the (N+1)th to (2N)th pairs of currents into a third common wire and flowing the other of each of the (N+1)th to (2N)th pairs of currents into a fourth common wire; a first current mirror connected between a first power supply terminal and first and second nodes, the first current mirror including a pair of second conductivity-type transistors that are connected to the first and second common wires at one ends, respectively, and connected to each other at control terminals, the first current mirror including a current input portion for flowing a current into one of the pair of second conductivity-type transistors in accordance with a current flowing through the first common wire and the second node and a current output portion for flowing a current into the other of the pair of second conductivity-type transistors in accordance with the current flowing through the one of the pair of second conductivity-type transistors; a second current mirror connected between a second power supply terminal and third and fourth nodes, the second current mirror including a pair of first conductivity-type transistors that are connected to the third and fourth common wires at one ends, respectively, and connected to each other at control terminals, the second current mirror including a current input portion for flowing a current into one of the pair of first conductivity-type transistors in accordance with a current flowing through the third common wire and the fourth node and a current output portion for flowing a current into the other of the pair of first conductivity-type transistors in accordance with the current flowing through the one of the pair of first conductivity-type transistors; a first floating current supply circuit connected between the second node to which an input node of the first current mirror is connected and the fourth node to which an input node of the second current mirror is connected; and a second floating current supply circuit connected between the first node to which an output node of the first current mirror is connected and the third node to which an output node of the second current mirror is connected. The output amplifier stage includes: a second conductivity-type first output transistor connected between a third power supply terminal and the output terminal, and connected to the first node at a control terminal; and a first conductivity-type second output transistor connected between a fourth power supply terminal and the output terminal, and connected to the third node at a control terminal. The amplification accelerator circuit includes first and second output nodes for outputting currents. When a weighted average voltage of the first to Nth input signals determined in accordance with a weighting ratio of each of the first to Nth differential stages and the (N+1)th to (2N)th differential stages is higher than a voltage of the output signal, the amplification accelerator circuit outputs a current from the first output node to add the current to a current flowing through the current output portion of the second current mirror, while cutting off a current output from the second output node. When the weighted average voltage is lower than the voltage of the output signal, the amplification accelerator circuit outputs a current from the second output node to add the current to a current flowing through the current output portion of the first current mirror, while cutting off a current output from the first output node. When the weighted average voltage is equal to the voltage of the output signal, the amplification accelerator circuit cuts off current outputs from both of the first and second output nodes.

A semiconductor device according to one aspect of the present invention is a semiconductor device including a data driver for driving a display device having an n (n is an integer of 2 or more) number of data lines in accordance with a video signal. The semiconductor device includes: a shift register for generating a latch timing signal on the basis of a start pulse and a clock signal; data register latches each for latching and outputting a pixel data signal of each pixel represented by the video signal in synchronization with the latch timing signal on a predetermined number basis; a level change circuit group for applying a level change process to each of the n number of pixel data signals outputted from the data register latches to increase a signal level, and generating an n number of level changed pixel data signals; a decoder circuit group for selecting an N (N is an integer of 1 or more) number of reference voltages corresponding to the respective level changed pixel data signals, out of a plurality of reference voltages different from each other, and generating an N number of reference voltage signals corresponding to the selected reference voltages; and an output circuit group including an n number of output circuits corresponding to the n number of data lines of the display device, each of the output circuits amplifying a weighted average voltage of the N number of reference voltage signals to generate an output signal and supplying the output signal to the corresponding data line of the display device. Each of the output circuits includes first to Nth input terminals for receiving the N number of reference voltage signals as first to Nth input signals, an output terminal for outputting the output signal, a differential input stage, an output amplifier stage, and an amplification accelerator circuit for accelerating an amplification operation of the output amplifier stage. The differential input stage includes: first conductivity-type first to Nth differential stages for generating first to Nth pairs of currents each of which corresponds to a difference between each of the first to Nth input signals and the output signal, and for flowing one of each of the first to Nth pairs of currents into a first common wire and flowing the other of each of the first to Nth pairs of currents into a second common wire; second conductivity-type (N+1)th to (2N)th differential stages for generating (N+1)th to (2N)th pairs of currents each of which corresponds to the difference between each of the first to Nth input signals and the output signal, and for flowing one of each of the (N+1)th to (2N)th pairs of currents into a third common wire and flowing the other of each of the (N+1)th to (2N)th pairs of currents into a fourth common wire; a first current mirror connected between a first power supply terminal and first and second nodes, the first current mirror including a pair of second conductivity-type transistors that are connected to the first and second common wires at one ends, respectively, and connected to each other at control terminals, the first current mirror including a current input portion for flowing a current into one of the pair of second conductivity-type transistors in accordance with a current flowing through the first common wire and the second node and a current output portion for flowing a current into the other of the pair of second conductivity-type transistors in accordance with the current flowing through the one of the pair of second conductivity-type transistors; a second current mirror connected between a second power supply terminal and third and fourth nodes, the second current mirror including a pair of first conductivity-type transistors that are connected to the third and fourth common wires at one ends, respectively, and connected to each other at control terminals, the second current mirror including a current input portion for flowing a current into one of the pair of first conductivity-type transistors in accordance with a current flowing through the third common wire and the fourth node and a current output portion for flowing a current into the other of the pair of first conductivity-type transistors in accordance with the current flowing through the one of the pair of first conductivity-type transistors; a first floating current supply circuit connected between the second node to which an input node of the first current mirror is connected and the fourth node to which an input node of the second current mirror is connected; and a second floating current supply circuit connected between the first node to which an output node of the first current mirror is connected and the third node to which an output node of the second current mirror is connected. The output amplifier stage includes a second conductivity-type first output transistor connected between a third power supply terminal and the output terminal, and connected to the first node at a control terminal; and a first conductivity-type second output transistor connected between a fourth power supply terminal and the output terminal, and connected to the third node at a control terminal. The amplification accelerator circuit includes first and second output nodes for outputting currents. When a weighted average voltage of the first to Nth input signals determined in accordance with a weighting ratio of each of the first to Nth differential stages and the (N+1)th to (2N)th differential stages is higher than a voltage of the output signal, the amplification accelerator circuit outputs a current from the first output node to add the current to a current flowing through the current output portion of the second current mirror, while cutting off a current output from the second output node. When the weighted average voltage is lower than the voltage of the output signal, the amplification accelerator circuit outputs a current from the second output node to add the current to a current flowing through the current output portion of the first current mirror, while cutting off a current output from the first output node. When the weighted average voltage is equal to the voltage of the output signal, the amplification accelerator circuit cuts off current outputs from both of the first and second output nodes.

A semiconductor device according to one aspect of the present invention is a semiconductor device having an output circuit including a differential input stage, an output amplifier stage, first to Nth (N is a positive integer of 1 or more) input terminals, and an output terminal for outputting an output signal. The semiconductor device includes an amplification accelerator circuit for accelerating an amplification operation of the output amplifier stage. The differential input stage includes first conductivity-type first to Nth differential stages for generating first to Nth pairs of currents each of which corresponds to a difference between each of the first to Nth input signals supplied to the respective first to Nth input terminals and the output signal, and for flowing one of each of the first to Nth pairs of currents into a first common wire and flowing the other of each of the first to Nth pairs of currents into a second common wire; second conductivity-type (N+1)th to (2N)th differential stages for generating (N+1)th to (2N)th pairs of currents each of which corresponds to the difference between each of the first to Nth input signals and the output signal, and for flowing one of each of the (N+1)th to (2N)th pairs of currents into a third common wire and flowing the other of each of the (N+1)th to (2N)th pairs of currents into a fourth common wire; a first current mirror connected between a first power supply terminal and first and second nodes, the first current mirror including a pair of second conductivity-type transistors that are connected to the first and second common wires at one ends, respectively, and connected to each other at control terminals, the first current mirror including a current input portion for flowing a current into one of the pair of second conductivity-type transistors in accordance with a current flowing through the first common wire and the second node and a current output portion for flowing a current into the other of the pair of second conductivity-type transistors in accordance with the current flowing through the one of the pair of second conductivity-type transistors; a second current mirror connected between a second power supply terminal and third and fourth nodes, the second current mirror including a pair of first conductivity-type transistors that are connected to the third and fourth common wires at one ends, respectively, and connected to each other at control terminals, the second current mirror including a current input portion for flowing a current into one of the pair of first conductivity-type transistors in accordance with a current flowing through the third common wire and the fourth node and a current output portion for flowing a current into the other of the pair of first conductivity-type transistors in accordance with the current flowing through the one of the pair of first conductivity-type transistors; a first floating current supply circuit connected between the second node to which an input node of the first current mirror is connected and the fourth node to which an input node of the second current mirror is connected; and a second floating current supply circuit connected between the first node to which an output node of the first current mirror is connected and the third node to which an output node of the second current mirror is connected. The output amplifier stage includes a second conductivity-type first output transistor connected between a third power supply terminal and the output terminal, and connected to the first node at a control terminal; and a first conductivity-type second output transistor connected between a fourth power supply terminal and the output terminal, and connected to the third node at a control terminal. The amplification accelerator circuit includes first and second output nodes for outputting currents. When a weighted average voltage of an M (M is an integer of 1 to N) number of input signals of the first to Nth input signals determined in accordance with a weighting ratio of each of the first to Nth differential stages and the (N+1)th to (2N)th differential stages is higher than a voltage of the output signal, the amplification accelerator circuit outputs a current from the first output node to add the current to a current flowing through the current output portion of the second current mirror, while cutting off a current output from the second output node. When the weighted average voltage is lower than the voltage of the output signal, the amplification accelerator circuit outputs a current from the second output node to add the current to a current flowing through the current output portion of the first current mirror, while cutting off a current output from the first output node. When the weighted average voltage is equal to the voltage of the output signal, the amplification accelerator circuit cuts off current outputs from both of the first and second output nodes.

A semiconductor device according to one aspect of the present invention is a semiconductor device including a data driver for driving a display device having an n (n is an integer of 2 or more) number of data lines in accordance with a video signal. The semiconductor device includes: a shift register for generating a latch timing signal on the basis of a start pulse and a clock signal; data register latches each for latching and outputting a pixel data signal of each pixel represented by the video signal in synchronization with the latch timing signal on a predetermined number basis; a level change circuit group for applying a level change process to each of the n number of pixel data signals outputted from the data register latches to increase a signal level, and generating an n number of level changed pixel data signals; a decoder circuit group for selecting an N (N is an integer of 1 or more) number of plurality of reference voltages corresponding to the respective level changed pixel data signals, out of a plurality of reference voltages different from each other, and generating an N number of reference voltage signals corresponding to the selected reference voltages; and an output circuit group including an n number of output circuits corresponding to the n number of data lines of the display device, each of the output circuits amplifying a weighted average voltage of the N number of reference voltage signals to generate an output signal and supplying the output signal to the corresponding data line of the display device. Each of the output circuits includes: first to Nth input terminals for receiving the N number of reference voltage signals as first to Nth input signals, an output terminal for outputting the output signal, a differential input stage, an output amplifier stage, and an amplification accelerator circuit for accelerating an amplification operation of the output amplifier stage. The differential input stage includes: first conductivity-type first to Nth differential stages for generating first to Nth pairs of currents each of which corresponds to a difference between each of the first to Nth input signals and the output signal, and for flowing one of each of the first to Nth pairs of currents into a first common wire and flowing the other of each of the first to Nth pairs of currents into a second common wire; second conductivity-type (N+1)th to (2N)th differential stages for generating (N+1)th to (2N)th pairs of currents each of which corresponds to the difference between each of the first to Nth input signals and the output signal, and for flowing one of each of the (N+1)th to (2N)th pairs of currents into a third common wire and flowing the other of each of the (N+1)th to (2N)th pairs of currents into a fourth common wire; a first current mirror connected between a first power supply terminal and first and second nodes, the first current mirror including a pair of second conductivity-type transistors that are connected to the first and second common wires at one ends, respectively, and connected to each other at control terminals, the first current mirror including a current input portion for flowing a current into one of the pair of second conductivity-type transistors in accordance with a current flowing through the first common wire and the second node and a current output portion for flowing a current into the other of the pair of second conductivity-type transistors in accordance with the current flowing through the one of the pair of second conductivity-type transistors; a second current mirror connected between a second power supply terminal and third and fourth nodes, the second current mirror including a pair of first conductivity-type transistors that are connected to the third and fourth common wires at one ends, respectively, and connected to each other at control terminals, the second current mirror including a current input portion for flowing a current into one of the pair of first conductivity-type transistors in accordance with a current flowing through the third common wire and the fourth node and a current output portion for flowing a current into the other of the pair of first conductivity-type transistors in accordance with the current flowing through the one of the pair of first conductivity-type transistors; a first floating current supply circuit connected between the second node to which an input node of the first current mirror is connected and the fourth node to which an input node of the second current mirror is connected; and a second floating current supply circuit connected between the first node to which an output node of the first current mirror is connected and the third node to which an output node of the second current mirror is connected. The output amplifier stage includes: a second conductivity-type first output transistor connected between a third power supply terminal and the output terminal, and connected to the first node at a control terminal; and a first conductivity-type second output transistor connected between a fourth power supply terminal and the output terminal, and connected to the third node at a control terminal. The amplification accelerator circuit includes first and second output nodes for outputting currents. When a weighted average voltage of an M (M is an integer of 1 to N) number of input signals of the first to Nth input signals determined in accordance with a weighting ratio of each of the first to Nth differential stages and the (N+1)th to (2N)th differential stages is higher than a voltage of the output signal, the amplification accelerator circuit outputs a current from the first output node to add the current to a current flowing through the current output portion of the second current mirror, while cutting off a current output from the second output node. When the weighted average voltage is lower than the voltage of the output signal, the amplification accelerator circuit outputs a current from the second output node to add the current to a current flowing through the current output portion of the first current mirror, while cutting off a current output from the first output node. When the weighted average voltage is equal to the voltage of the output signal, the amplification accelerator circuit cuts off current outputs from both of the first and second output nodes.

According to the present invention, a current corresponding to the difference between an input signal voltage and an output signal voltage is generated as an amplification acceleration current. The amplification acceleration current is provided to the output node of the current mirror, which drives the transistor in the output amplifier stage, and therefore added to a current to drive the transistor in the output amplifier stage. Therefore, it is possible to perform a high-speed amplification operation that follows variations in the input signal voltage.

BRIEF DESCRIPTION OF THE DRAWINGS

FIG. 16A is a diagram illustrating an example of the magnitude relationship of power voltages to be applied to power supply terminals E1 to E8;

FIG. 16B is a diagram illustrating another example of the magnitude relationship of power voltages to be applied to the power supply terminals E1 to E8;

FIG. 16C is a diagram illustrating yet another example of the magnitude relationship of power voltages to be applied to the power supply terminals E1 to E8;

FIG. 16D is a diagram illustrating yet another example of the magnitude relationship of power voltages to be applied to the power supply terminals E1 to E8;

FIG. 16E is a diagram illustrating yet another example of the magnitude relationship of power voltages to be applied to the power supply terminals E1 to E8;

FIG. 16F is a diagram illustrating yet another example of the magnitude relationship of power voltages to be applied to the power supply terminals E1 to E8;

FIG. 16G is a diagram illustrating yet another example of the magnitude relationship of power voltages to be applied to the power supply terminals E1 to E8;

DETAILED DESCRIPTION OF THE INVENTION

First Embodiment

Figure 1:
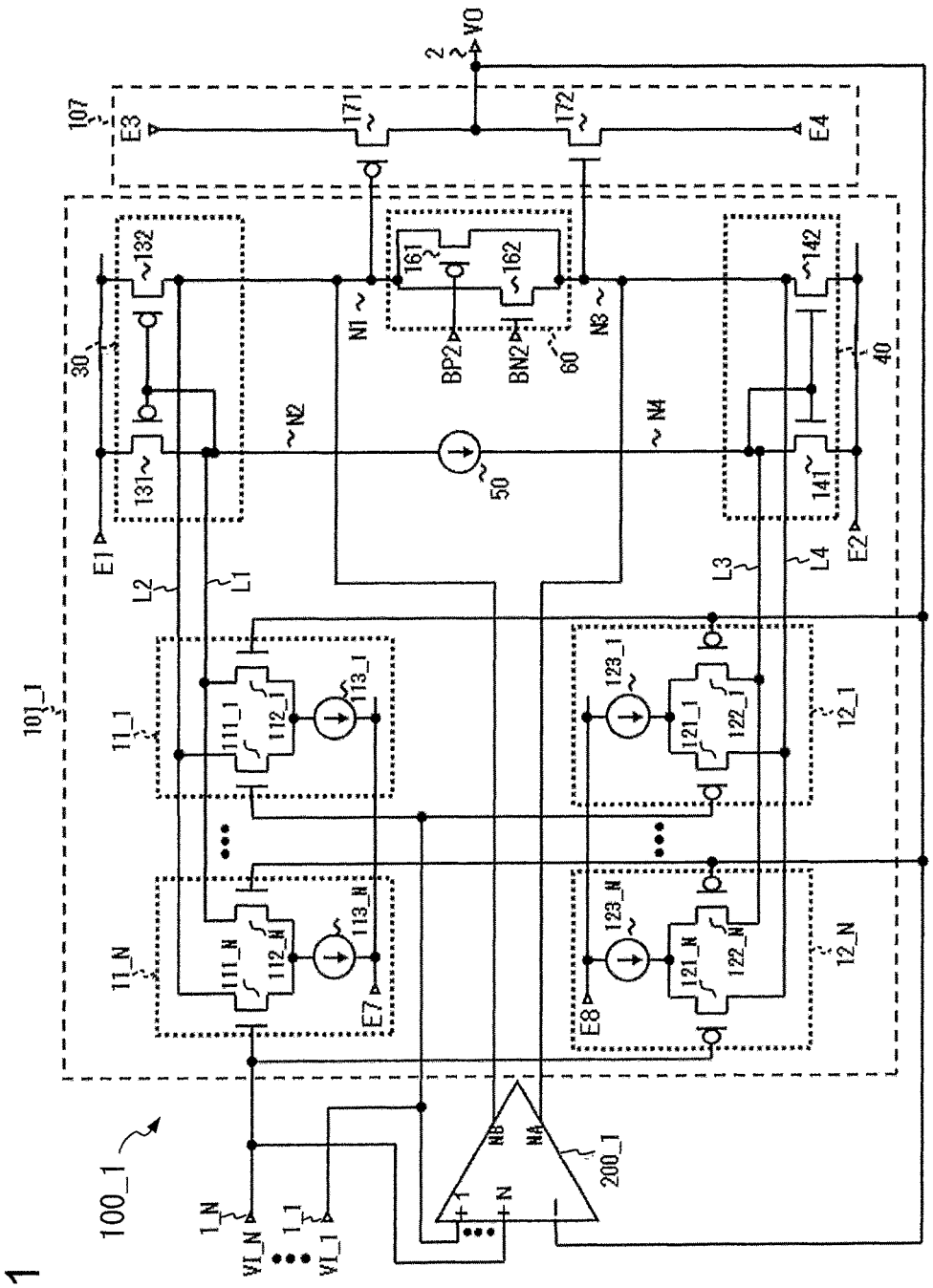
FIG. 1 is a circuit diagram of an output circuit according to a first embodiment as a semiconductor device according to the present invention.

FIG. 1 is a circuit diagram of a first embodiment of an output circuit, as a semiconductor device according to the present invention. In the following description, a P-channel MOS (metal oxide semiconductor) transistor is referred to as a Pch transistor, and an N-channel MOS transistor is referred to as an Nch transistor.

As illustrated in FIG. 1, an output circuit 100_1 includes a differential input stage 101_1, an output amplifier stage 107, and an amplification accelerator circuit 200_1.

The differential input stage 101_1 generates a P-channel drive potential and an N-channel drive potential on the basis of the potential difference between each of input signal voltages VI_1 to VI_N to be inputted to first to Nth (N is an integer of 1 or more) input terminals 1_1 to 1_N, respectively, and an output signal voltage VO of an output terminal 2. The differential input stage 101_1 supplies the P-channel drive potential to a gate of the Pch transistor 171 of the output amplifier stage 107 through a first output node N1, and supplies the N-channel drive potential to a gate of the Nch transistor 172 of the output amplifier stage 107 through a second output node N3.

The output amplifier stage 107 outputs the output signal voltage VO, which has the weighted average voltage value of the input signal voltages VI_1 to VI_N determined by a predetermined weighting ratio and is obtained by push-pull amplification in accordance with the P-channel drive potential and the N-channel drive potential, through the output terminal 2. The amplification accelerator circuit 200_1 detects the potential difference between the weighted average voltage value of the input signal voltages VI_1 to VI_N and the output signal voltage VO, and accelerates the amplification operation of the differential input stage 101_1 and the output amplifier stage 107 in accordance with the potential difference.

As illustrated in FIG. 1, the differential input stage 101_1 includes N number of first conductivity-type (i.e., Nch) differential stages 11_1 to 1_N, N number of second conductivity-type (Pch) differential stages 12_1 to 12_N, a first current mirror (i.e., Pch current mirror) 30, a second current mirror (i.e., Nch current mirror) 40, a first floating current supply circuit 50, and a second floating current supply circuit 60.

The Nch differential stage 11_1 includes a pair of Nch transistors (i.e., a pair of differential transistors) (111_1 and 112_1) and a current supply 113_1. The pair of Nch transistors (111_1 and 112_1) are connected to each other at their sources, and connected to the input terminal 1_1 supplied with the input signal voltage VI_1 and the output terminal 2 at their gates, respectively. The current supply 113_1 is connected to a seventh power supply terminal E7 at one end, and connected to the sources of the pair of Nch differential transistors (111_1 and 112_1) at the other end.

The Nch differential stage 112 includes a pair of Nch transistors (i.e., a pair of differential transistors) (1112 and 1122) and a current supply 113_2. The pair of Nch transistors (111_2 and 1122) are connected to each other at their sources, and connected to the input terminal 12 supplied with the input signal voltage VI_2 and the output terminal 2 at their gates, respectively. The current supply 113_2 is connected to the seventh power supply terminal E7 at one end, and connected to the sources of the pair of Nch differential transistors (111_2 and 1122) at the other end.

In the same manner, the Nch differential stage 11_N includes a pair of Nch transistors (i.e., a pair of differential transistors) (111_N and 112_N) and a current supply 113_N. The pair of Nch transistors (111_N and 112_N) are connected to each other at their sources, and connected to the input terminal 1_N supplied with the input signal voltage VI_N and the output terminal 2 at their gates, respectively. The current supply 113_N is connected to the seventh power supply terminal E7 at one end, and connected to the coupled sources of the pair of Nch differential transistors (111_N and 112_N) at the other end.

The Nch differential stages 11_1 to 11_N are commonly connected to one another at one of a pair of outputs, and are commonly connected to one another at the other of the pair of outputs. In other words, the Nch transistors 112_1 to 112_N are commonly connected to one another at their drains through a first common wire L. The Nch transistors 111_1 to 111_N are commonly connected to one another at their drains through a second common wire L2.

According to the above-described configuration, the differential stages 11_1 to 11_N generate first to Nth pairs of currents, which correspond to the difference between each of the first to Nth input signals supplied to the respective first to Nth input terminals and the output signal, respectively. One of each of the first to Nth pairs of currents flows into the first common wire L1, while the other of each of the first to Nth pairs of currents flows into the second common wire L2.

The Pch differential stage 12_1 includes a pair of Pch transistors (a pair of differential transistors) (121_1 and 122_1) and a current supply 123_1. The pair of Pch transistors (121_1 and 122_1) are connected to each other at their sources, and connected to the input terminal 1_1 supplied with the input signal voltage VI_1 and the output terminal 2 at their gates, respectively. The current supply 123_1 is connected to an eighth power supply terminal E8 at one end, and connected to the coupled sources of the pair of Pch differential transistors (121_1 and 122_1) at the other end.

In the same manner, the Pch differential stage 12_N includes a pair of Pch transistors (a pair of differential transistors) (121_N and 122_N) and a current supply 123_N. The pair of Pch transistors (121_N and 122_N) are connected to each other at their sources, and connected to the input terminal 1_N supplied with the input signal voltage VI_N and the output terminal 2 at their gates, respectively. The current supply 123_N is connected to the eighth power supply terminal E8 at one end, and connected to the coupled sources of the pair of Pch differential transistors (121_N and 122_N) at the other end.

The Pch differential stages 12_1 to 12_N are commonly connected to one another at one of a pair of outputs, and are commonly connected to one another at the other of the pair of outputs. In other words, the Pch transistors 122_1 to 122_N are commonly connected to one another at their drains through a third common wire L3. The Pch transistors 121_1 to 121_N are commonly connected to one another at their drains through a fourth common wire L4.

According to the above-described configuration, the differential stages 12_1 to 12_N generate (N+1)th to (2N)th pairs of currents, which correspond to the difference between each of the first to Nth input signals supplied to the respective first to Nth input terminals and the output signal, respectively. One of each of the (N+1)th to (2N)th pairs of currents flows into the third common wire L3, while the other of each of the (N+1)th to (2N)th pairs of currents flows into the fourth common wire L4.

The first current mirror 30 includes a pair of Pch transistors (132 and 131), which are commonly connected to a first power supply terminal E1 for applying a high power voltage at their sources, and connected to the first node N1 and a second node N2 at their drains, respectively. The pair of Pch transistors (132 and 131) are connected to each other at their gates, and the gates are connected to the node N2, which is a drain node of the Pch transistor 131. The first node N1 is an output terminal of the current mirror 30, while the second node N2 is an input terminal of the current mirror 30. The pair of outputs of each of the Nch differential stages 11_1 to 11_N are connected to the first and second nodes N1 and N2, respectively. That is, the Nch transistors 111_1 to 111_N are connected to the first node N1 through the common wire L2 at their drains, while the Nch transistors 112_1 to 112_N are connected to the second node N2 through the common wire L1 at their drains.

In short, the first current mirror 30 is connected between the first power supply terminal E1 and the first and second nodes (N1 and N2). The first current mirror 30 includes a current input portion for passing a current through the Pch transistor 131 in accordance with a current flowing through the first common wire L1 and the node N2, and a current output unit for passing a current through the Pch transistor 132 in accordance with a current flowing through the Pch transistor 131.

The second current mirror 40 includes a pair of Nch transistors (142 and 141), which are commonly connected to a second power supply terminal E2 for applying a low power voltage at their sources, and connected to the third node N3 and a fourth node N4 at their drains, respectively. The pair of Nch transistors (142 and 141) are connected to each other at their gates, and the gates are connected to the fourth node N4, which is a drain node of the Nch transistor 141. The pair of nodes (N3 and N4) are an output terminal and an input terminal of the Nch current mirror 40, respectively. The pair of outputs of each of the Pch differential stages 12_1 to 12_N are connected to the third and fourth nodes N3 and N4, respectively. That is, the Pch transistors 121_1 to 121_N are connected to the third node N3 through the common wire L4 at their drains, while the Pch transistors 122_1 to 122_N are connected to the fourth node N4 through the common wire L4 at their drains.

In short, the second current mirror 40 is connected between the second power supply terminal E2 and the third and fourth nodes (N3 and N4). The second current mirror 40 includes a current input portion for passing a current through the Nch transistor 141 in accordance with a current flowing through the third common wire L3 and the node N4, and a current output unit for passing a current through the Nch transistor 142 in accordance with a current flowing through the Nch transistor 141.

The first floating current supply circuit 50 includes a constant current supply connected between the node N2, i.e., the input node of the first current mirror 30 and the node N4, i.e., the input node of the second current mirror 40.

The second floating current supply circuit 60 includes a Pch transistor 161 and an Nch transistor 162, which are connected in parallel between the node N1, i.e., the output node of the first current mirror 30 and the node N3, i.e., the output node of the second current mirror 40. Bias voltages BP2 and BN2 are supplied to the gates of the Pch transistor 161 and the Nch transistor 162, respectively.

The first floating current supply circuit 50 may be constituted of, for example, a floating current supply including a Pch transistor and an Nch transistor connected in parallel, just as with the second floating current supply circuit 60. Alternatively, the first floating current supply circuit 50 may be constituted of a floating current supply including an Nch transistor and a Pch transistor that are supplied with bias voltages at their gates and connected in series between the input nodes (N2 and N4) of the current mirrors 30 and 40.

The output amplifier stage 107 includes the Pch transistor 171 and the Nch transistor 172. The Pch transistor 171 is connected between a third power supply terminal E3 for applying a high power voltage for output and the output terminal 2, and connected to the node N1 of the differential input stage 101 at its gate. The Nch transistor 172 is connected between a fourth power supply terminal E4 for applying a lower power voltage for output and the output terminal 2, and connected to the node N3 of the differential input stage 101 at its gate.

Note that the power supply terminals E1 and E3 may be connected to a common power supply (VDD), and the power supply terminals E2 and E4 may be connected to a common power supply (VSS) or the like. The power voltage to be applied to each of the power supply terminals will be described later. In this and the following embodiments, the power supply terminal E1 is supplied with a higher power voltage than the power supply terminal E2. The power supply terminal E3 is supplied with a higher power voltage than the power supply terminal E4.

In FIG. 1, the first to Nth input terminals 1_1 to 1_N are connected to noninverting input terminals of the Nch differential stages 11_1 to 11_N and the Pch differential stages 12_1 to 12_N, respectively. Note that, when N=1, the input terminal 1_1, the Nch differential stage 11_1, and the Pch differential stage 12_1 are present. Each embodiment of the present invention describes a configuration example in which N is two or more, for convenience sake.

The output terminal 2 is feedback connected to each of inverting input terminals of the Nch differential stages 11_1 to 11_N and the Pch differential stages 12_1 to 12_N.

The input signal voltages VI_1 to VI_N are each a step signal voltage. The input signal voltages constitute a group of an N number of voltages including equal voltages within a sufficient small voltage range relative to a step signal voltage range.

The output signal voltage VO functions as a voltage follower, which follows the weighted average voltage of the group of the N number of voltages (input signal voltages VI_1 to VI_N) determined by the predetermined weighting ratio in the same phase and varies.

The amplification accelerator circuit 200_1 has two output nodes NA and NB. The amplification accelerator circuit 200_1 receives the input signal voltages VI_1 to VI_N and the output signal voltage VO, and performs a comparison between the weighted average voltage of the first to Nth input signal voltages VI_1 to VI_N and the output signal voltage VO. When the weighted average voltage of the first to Nth input signal voltages VI_1 to VI_N is higher than the output signal voltage VO, the amplification accelerator circuit 200_1 outputs an output current Ia as a sink current (suction current) from the output node NA, and adds the output current Ia to an output current of the Nch current mirror 40 of the output circuit. At this time, the amplification accelerator circuit 200_1 outputs no current from the output node NB.

On the other hand, when the weighted average voltage of the first to Nth input signal voltages VI_1 to VI_N is lower than the output signal voltage VO, the amplification accelerator circuit 200_1 outputs an output current Ib as a source current (discharge current) from the output node NB, and adds the output current Ib to an output current of the Pch current mirror 30 of the output circuit. At this time, the amplification accelerator circuit 200_1 outputs no current from the output node NA.

It is noted that when the weighted average voltage of the first to Nth input signal voltages VI_1 to VI_N is equal to the output signal voltage VO, the amplification accelerator circuit 200_1 outputs neither an output current Ia nor an output current Ib.

In short, when the weighted average voltage of the first to Nth input signal voltages VI_1 to VI_N is higher than the voltage of the output signal VO, the amplification accelerator circuit 200_1 outputs a current from the first output node NA and adds the current to a current flowing through the current output portion (142) of the second current mirror 40, while cutting off a current output from the second output node NB. On the other hand, when the weighted average voltage is lower than the voltage of the output signal VO, the amplification accelerator circuit 200_1 outputs a current from the second output node NB and adds the current to a current flowing through the current output portion (132) of the first current mirror 30, while cutting off a current output from the first output node NA. Note that, when the weighted average voltage is equal to the voltage of the output signal, the amplification accelerator circuit 200_1 cuts off current outputs from both of the first and second output nodes NA and NB.

The operation of the output circuit 100_1 will next be described by taking a case where the transistors constituting the k-th (k is an integer of 1 to N) Nch differential pair of the Nch differential stages 11_1 to 11_N have an Ak times size ratio, with respect to a predetermined standard size ratio (W/L ratio) determined by a channel width W relative to a channel length L, that is, have a weighting ratio of Ak, as an example.

Drain currents I(111_k) and I(112_k) of the k-th Nch differential pair (111_k and 112_k) are represented by the following equations.

$$I(111\_k)=(Ak\cdot\beta/2)\cdot(VI\_k-VTH)^2 \quad (10)$$

$$I(112\_k)=(Ak\cdot\beta/2)\cdot(VO-VTH)^2 \quad (11)$$

wherein, $\beta$ is a gain factor when a transistor has a standard size ratio of 1, and VTH is a threshold voltage.

The commonly connected output pairs of the Nch differential stages 11_1 to 11_N are connected to the input (node N2) and the output (node N1) of the current mirror 30, and controlled so as to equalize output currents of the commonly connected output pairs of the Nch differential stages 11_1 to 11_N.

Thus, output currents of the Nch differential stages 11_1 to 11_N have the following relationship.

$$I(111\_1)+I(111\_2)+\ldots+I(111\_N)=I(112\_1)+I(1122)+\ldots+I(112\_N) \quad (12)$$

In the above-described equations (10) and (11), k is expanded in the range of 1 to N and substituted into the equation (12).

As to the first order of the threshold voltage VTH, the following equation holds when both sides are equal.

$$A1\cdot VI\_1+A2\cdot VI\_2+\ldots+An\cdot VI\_N=(A1+A2+\ldots+An)\times VO \quad (13)$$

Thus, the following equation (14) is obtained.

$$VO=(A1\cdot VI\_1+A2\cdot VI\_2+\ldots+An\cdot VI\_N)/(A1+A2+\ldots+An) \quad (14)$$

Otherwise, when gm is the mutual conductance of an Nch differential pair of a standard size, and Ak·gm is the mutual conductance of the k-th differential pair having the weighting ratio of Ak, the following equation holds as to the k-th (k=1 to N) Nch differential pair (111_k and 112_k).

$$I(111\_k)-I(112\_k)=Ak\cdot gm(VI\_k-VO) \quad (15)$$

Here, expanding k in the range of 1 to N and substituting the expanded equation into the equation (12) also provides the above-described equation (14).

Performing the same calculations as to the Pch differential stages 12_1 to 12_N provides an equivalent equation. Therefore, as represented by the equation (14), the output circuit 100_1 outputs a voltage value in which the sum (A1·VI_1+A2·VI_2+ . . . +An·VI_N) of products of the input signal voltage and the weighting ratio of each differential pair is divided by the sum (A1+A2+ . . . +An) of the weighting ratios, that is, an average value (referred to as weighted average) weighted by the input signal voltages VI_1 to VI_N, as the output signal voltage VO.

Figure 2:
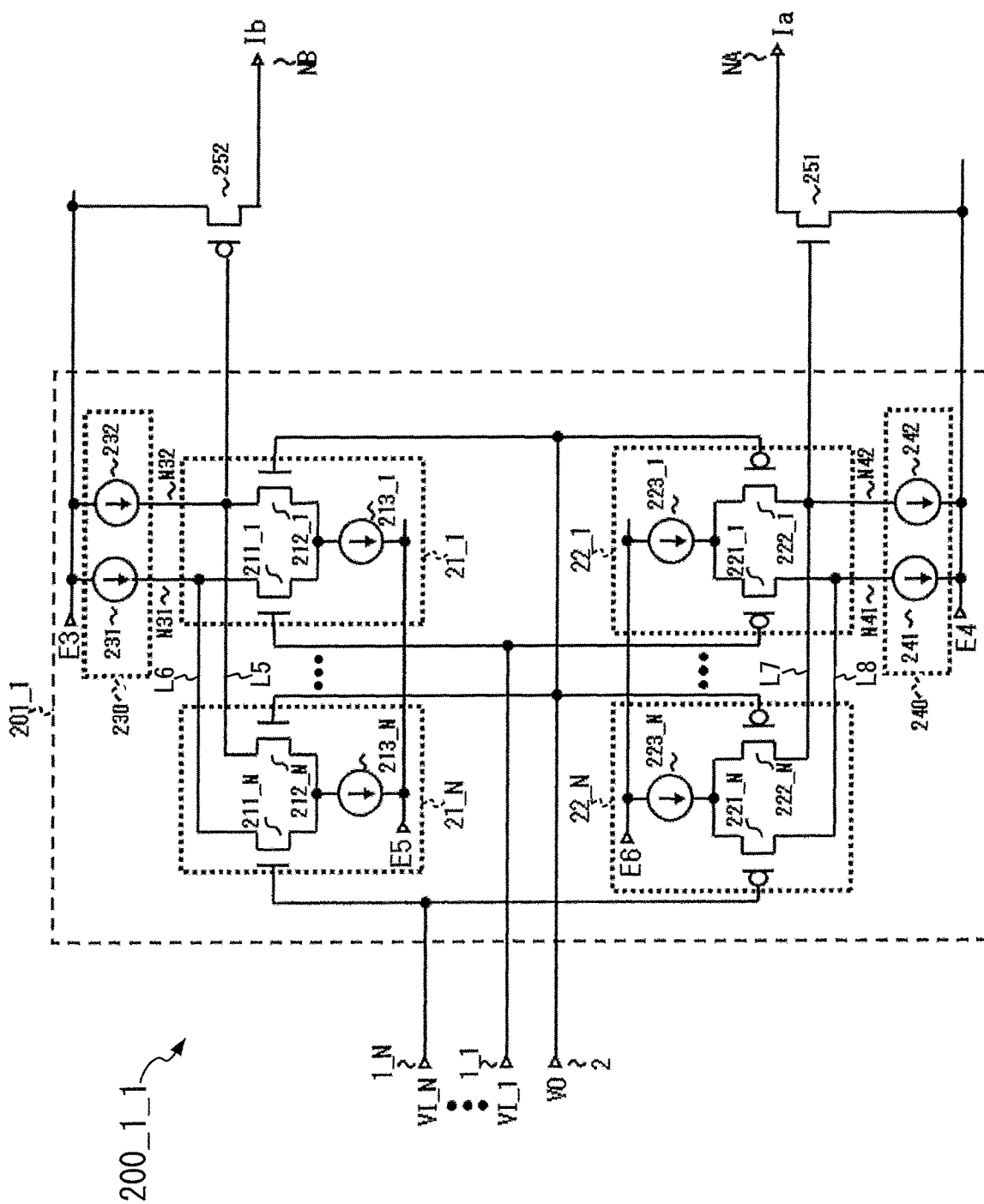
FIG. 2 is a circuit diagram illustrating the internal configuration of an amplification accelerator circuit 200_1_1 as an example of an amplification accelerator circuit 200_1.

FIG. 2 is a circuit diagram illustrating the internal configuration of an amplification accelerator circuit 200_1_1, as an example of the amplification accelerator circuit 200_1 illustrated in FIG. 1.

As illustrated in FIG. 2, the amplification accelerator circuit 200_1_1 includes an Nch current control transistor 251, a Pch current control transistor 252, and a comparator circuit 201_1. The Nch current control transistor 251 is connected between the first output node NA and the fourth power supply terminal E4. The Pch current control transistor 252 is connected between the second output node NB and the third power supply terminal E3. To the comparator circuit 201_1, the input signal voltages VI_1 to VI_N and the output signal voltage VO are inputted. The comparator circuit 201_1 outputs a signal in which a current corresponding to a comparison result between the input signal voltages VI_1 to VI_N and the output signal voltage VO is converted into a voltage that refers to the voltages of the third and fourth power supply terminals E3 and E4.

A first output terminal of the comparator circuit 201_1 is connected to the gate of the Nch current control transistor 251. A second output terminal of the comparator circuit 201_1 is connected to the gate of the Pch current control transistor 252.

An Nch differential stage 21_1 of the comparator circuit 201_1 includes a pair of Nch transistors (a pair of differential transistors) (211_1 and 212_1) and a current supply 213_1. The pair of Nch transistors (211_1 and 212_1) are connected to each other at their sources, and connected to the input terminal 1_1 and the output terminal 2 at their gates, respectively. The current supply 213_1 is connected to a fifth power supply terminal E5 at one end, and connected to the sources of the pair of Nch differential transistors (211_1 and 212_1) at the other end.

In the same manner, an Nch differential stage 21_N includes a pair of Nch transistors (a pair of differential transistors) (211_N and 212_N) and a current supply 213_N. The pair of Nch transistors (211_N and 212_N) are connected to each other at their sources, and connected to the input terminal 1_N and the output terminal 2 at their gates, respectively. The current supply 213_N is connected to the fifth power supply terminal E5 at one end, and connected to the sources of the pair of Nch differential transistors (211_N and 212_N) at the other end.

The Nch differential stages 21_1 to 21_N are commonly connected to one another at one of a pair of outputs, and are commonly connected to one another at the other of the pair of outputs. In other words, the Nch transistors 212_1 to 212_N are commonly connected to one another at their drains through a fifth common wire L5. The Nch transistors 211_1 to 211_N are commonly connected to one another at their drains through a sixth common wire L6. Furthermore, the comparator circuit 201_1 includes a pair of load elements (231 and 232) connected between each of a pair of common outputs (L5 and L6) of the Nch differential stages 21_1 to 21_N and the third power supply terminal E3. A connection point N32, which is one (inverting input side) of a pair of connection points (N31 and N32) between the common output pair of the Nch differential stages 21_1 to 21_N and the load element pair (231 and 232), is connected to the gate of the Pch current control transistor 252, as a second output terminal of the comparator circuit 201_1.

In the comparator circuit 201_1, a Pch differential stage 22_1 includes a pair of Pch transistors (a pair of differential transistors) (221_1 and 222_1) and a current supply 223_1. The pair of Pch transistors (221_1 and 222_1) are connected to each other at their sources, and connected to the input terminal 1_1 and the output terminal 2 at their gates, respectively. The current supply 223_1 is connected to a sixth power supply terminal E6 at one end, and connected to the sources of the pair of Pch differential transistors (221_1 and 222_1) at the other end.

In the same manner, a Pch differential stage 22_N includes a pair of Pch transistors (a pair of differential transistors) (221_N and 222_N) and a current supply 223_N. The pair of Pch transistors (221_N and 222_N) are connected to each other at their sources, and connected to the input terminal 1_N and the output terminal 2 at their gates, respectively. The current supply 223_N is connected to the sixth power supply terminal E6 at one end, and connected to the sources of the pair of Pch differential transistors (221_N and 222_N) at the other end.

The Pch differential stages 22_1 to 22_N are commonly connected to one another at one of a pair of outputs, and are commonly connected to one another at the other of the pair of outputs. In other words, the Pch transistors 222_1 to 222_N are commonly connected to one another at their drains through a seventh common wire L7. The Pch transistors 221_1 to 221_N are commonly connected to one another at their drains through an eighth common wire L8.

Furthermore, the comparator circuit 201_1 includes a pair of load elements (241 and 242) connected between each of a pair of common outputs (L7 and L8) of the Pch differential stages 22_1 to 22_N and the fourth power supply terminal E4. A connection point N42, which is one (inverting input side) of a pair of connection points (N41 and N42) between the common output pair of the Pch differential stages 22_1 to 22_N and the load element pair (241 and 242), is connected to the gate of the Nch current control transistor 251, as a first output terminal of the comparator circuit 201_1.

According to the above-described configuration, when the Nch current control transistor 251 is in an on state, the amplification accelerator circuit 200_1_1 outputs an output current Ia (also referred to as sink current) from the first output node NA. At this time, the output current Ia is added to an output current of the current mirror 40 of the output circuit 100_1. Also, when the Pch current control transistor 252 is in an on state, the amplification accelerator circuit 200_1_1 outputs an output current Ib (source current) from the second output node NB. At this time, the output current Ib is added to an output current of the current mirror 30 of the output circuit 100_1.

In FIG. 2, the pair of load elements (231 and 232) are each constituted of a current supply, but are not limited to the current supply as a matter of course. For example, the load element may be an element that can switch a current supply 233 between an active state and an inactive state in accordance with the output currents of the common output pair of the Nch differential stages 21_1 to 21_N. Specifically, a pair of resistors, a pair of diodes, or a current mirror circuit may be used as a substitute for the current supplies 231 and 232 constituting the pair of load elements.

In the same manner, a pair of resistors, a pair of diodes, or a current mirror circuit may be used as a substitute for the pair of load elements (241 and 242). The same goes for the configurations of amplification accelerator circuits other than FIG. 2.

Next, the operation of the amplification accelerator circuit 200_1_1 illustrated in FIG. 2 will be described. It is noted that the transistors constituting each of the Nch differential stages 21_1 to 21_N have a size weighted in the same manner as the Nch differential stages 11_1 to 11_N of the output circuit 100_1 of FIG. 1. That is, the transistors constituting the k-th Nch differential pair are Ak times (in the case of having a weighting ratio of Ak) larger with respect to a predetermined standard size ratio. Drain currents I(211_k) and I(212_k) of the k-th (k is an integer of 1 to N) Nch differential pair (211_k and 212_k) are represented as follows.

$$I(211\_k) = (Ak \cdot \beta/2) \cdot (VI\_k - VTH)^2 \tag{16}$$

$$I(212\_k) = (Ak \cdot \beta/2) \cdot (VO - VTH)^2 \tag{17}$$

wherein, β is a gain factor when a transistor has a standard size ratio of 1, and VTH is a threshold voltage.

The commonly connected output pairs of the Nch differential stages 21_1 to 21_N are connected to the load element pair (231 and 232). For example, when the pair of load elements 231 and 232 are constituted so as to have an equivalent characteristic, that is, when the pair of load elements are constituted of current supplies, both output currents are determined at an equal level. When the pair of load elements are constituted of resistors, the resistors are determined so as to have an equal resistance.

Thus, during a stable operation (or, stable output state), the current of an output common connection point of one of a pair of outputs of the Nch differential stages 21_1 to 21_N becomes equal to the current of an output common connection point of the other of the pair of outputs, and the pair of common outputs of the Nch differential stages 21_1 to 21_N have the same potential as a pair of connection points of the load element pair 231 and 232. During the stable operation (or, stable output state), the Pch current control transistor 252 is in an off state. At this time, output currents of one of a pair of outputs of the respective Nch differential stages 21_1 to 21_N, that is, drain currents I(211_1) to I(211_N) of the Nch transistors 211_1 to 211_N and output currents of the other of the pair of outputs of the respective Nch differential stages 21_1 to 21_N, that is, drain currents I(212_1) to I(212_N) of the Nch transistors 212_1 to 212_N have the following relationship.

$$I(211\_1)+I(211\_2)+\ldots+I(211\_N)=I(212\_1)+I(212\_2)+\ldots+I(212\_N) \quad (18)$$

In the above-described equations (16) and (17), k is expanded in the range of 1 to N and substituted into the equation (18). At this time, as to the first order of the threshold voltage VTH, the following equation holds when both sides are equal.

$$A1\cdot VI\_1+\ldots+An\cdot VI\_N=(A1+\ldots+An)\times VO \quad (19)$$

Thus, the following equation (20) is obtained.

$$VO=(A1\cdot VI\_1+\ldots+An\cdot VI\_N)/(A1+\ldots+An) \quad (20)$$

Performing the same calculations as to output currents of one and the other of each pair of outputs of the Pch differential stages 22_1 to 22_N provides an equation equivalent to the equation (20). It is noted that during the stable operation (stable output state), the Nch current control transistor 251 is in an off state.

As represented by the above-described equation (20), the amplification accelerator circuit 200_1_1 becomes the stable operation state (stable output state), when the output signal voltage VO becomes equal to the weighted average voltage of the input signal voltages VI_1 to VI_N.

When the output signal voltage VO is lower than the weighted average voltage of the input signal voltages VI_1 to VI_N, that is, when the weighted average voltage of the input signal voltages VI_1 to VI_N is on the side of the power supply terminal E3 (i.e., high voltage side) relative to the output signal voltage VO, the value of an output current of one of the pair of common outputs of the Pch differential stages 22_1 to 22_N of the comparator circuit 201_1, that is, a common drain of the inverting input side Pch transistors 222_1 to 222_N and the connection point N42 of the load element 242 is increased, as compared with a current value during the stable operation.

As a result, the gate potential of the Nch current control transistor 251 is increased to be activated. The Nch current control transistor 251 outputs a sink current Ia from an output node Na of the amplification accelerator circuit 200_1_1. Also, the value of an output current of one of the pair of common outputs of the Nch differential stages 21_1 to 21_N of the comparator circuit 201_1, that is, a common drain of the inverting input side Nch transistors 212_1 to 212_N and the connection point N32 of the load element 232 is decreased, as compared with the current value during the stable operation. Thus, the Pch current control transistor 252 is in an inactive state, and an output current Ib does not flow.

On the other hand, when the output signal voltage VO is higher than the weighted average voltage of the input signal voltages VI_1 to VI_N, that is, when the weighted average voltage of the input signal voltages VI_1 to VI_N is on the side of the power supply terminal E4 (low voltage side) relative to the output signal voltage VO, the value of an output current of one of the pair of common outputs of the Nch differential stages 21_1 to 21_N of the comparator circuit 201_1, that is, the common drain of the Nch transistors 212_1 to 212_N and the connection point N32 of the load element 232 is increased, as compared with a current value during the stable operation. As a result, the gate potential of the Pch current control transistor 252 is decreased to be activated. The Pch current control transistor 252 outputs a source current Ib from an output node Nb of the amplification accelerator circuit 200_1_1. Also, the value of an output current of one of the pair of common outputs of the Pch differential stages 22_1 to 22_N of the comparator circuit 201_1, that is, the common drain of the Pch transistors 222_1 to 222_N and the connection point N42 of the load element 242 is decreased, as compared with the current value during the stable operation. Thus, the Nch current control transistor 251 is in an inactive state, and an output current Ia does not flow.

The operation of the output circuit 100_1 illustrated in FIG. 1 will next be described. The operation of the output circuit except the amplification accelerator circuit 200_1 will be first described.

First, an operation when the input signal voltages VI_1 to VI_N vary as step voltages and the weighted average voltage of the input signal voltages VI_1 to VI_N is changed to the side of the power supply terminal E1 (i.e., high voltage side) relative to the output signal voltage VO of the output terminal 2 will be described.

In this case, the output current of one of the pair of common outputs of the Nch differential stages 11_1 to 11_N, that is, the common drain (L2) of the Nch transistors 111_1 to 111_N is increased, while the output current of the other of the pair of common outputs of the Nch differential stages 11_1 to 11_N, that is, the common drain of the Nch transistors 112_1 to 112_N is decreased. Due to the decrease in the output current of the common drain of the Nch transistors 112_1 to 112_N, the input current of the current mirror 30, that is, the drain current (absolute value) of the diode-connected Pch transistor 131 is decreased. The decrease in the drain current of the Pch transistor 131 causes a reduction in the gate-source voltage (absolute value) of the Pch transistor 131, and accordingly the gate voltage of the Pch transistor 131 is changed to the high voltage side. Therefore, the gate-source voltage (absolute value) of the Pch transistor 132 the gate of which is mutually connected to the Pch transistor 131 is reduced, and the gate voltage thereof is changed to the high voltage side, and therefore the drain current (absolute value) of the Pch transistor 132 is reduced. On the other hand, since the output current of the common drain of the Nch transistors 111_1 to 111_N of the Nch differential stages 11_1 to 11_N is increased, the P-channel drive potential is decreased at the node N1.

In other words, the common drain (L2) of the Nch transistors 111_1 to 111_N of the Nch differential stages 11_1 to 11_N is connected to the drain of the Pch transistor 132 and the node N1. Thus, when the drain current (discharge current) of the Pch transistor 132 is decreased and the current (suction current) of the common drain of the Nch transistors 111_1 to 111_N of the Nch differential stages 11_1 to 1_N is increased, the amount of discharge of electric charge is increased at the node N1, and therefore the P-channel drive potential is decreased at the node N1.

When the weighted average voltage of the input signal voltages VI_1 to VI_N is changed to the side of the power supply terminal E1 (high voltage side) relative to the output signal voltage VO of the output terminal 2, the output current of one of the pair of common outputs of the Pch differential stages 12_1 to 12_N, that is, the common drain (L4) of the Pch transistors 121_1 to 121_N is decreased, while the output current of the common drain (L3) of the Pch transistors 122_1 to 122_N is increased. Due to the increase in the output current of the common drain (L3) of the Pch transistors 122_1 to 122_N, the drain current of the diode-connected Nch transistor 141 of the current mirror 40 is increased. The increase in the drain current of the Nch transistor 141 causes an increase in the gate-source voltage of the Nch transistor 141. Accordingly, the gate-source voltage of the Nch transistor 142 the gate of which is connected to the gate of the Nch transistor 141 is also increased, and the drain current of the Nch transistor 142 is increased. On the other hand, the output current of the common drain of the Pch transistors 121_1 to 121_N of the Pch differential stages 12_1 to 12_N is decreased. Therefore, the sum of the output current of the common drain (L4) of the Pch transistors 121_1 to 121_N and the current from the second floating current supply circuit 60 is decreased, and a current flowing through the Pch transistor 142 is increased, thus reducing the N-channel drive potential at the node N3.

Due to the reduction in the P-channel drive potential at the node N1 and the N-channel drive potential at the node N3, the drain current of the Pch transistor 171 of the output amplifier stage 107, that is, a charging current from the power supply terminal E3 to the output terminal 2 is increased, while the drain current of the Nch transistor 172, that is, a discharge current from the output terminal 2 to the power supply terminal E4 is decreased. Therefore, the output signal voltage VO of the output terminal 2 is increased. When the output signal voltage VO gets close to the weighted average voltage of the input signal voltages VI_1 to VI_N, the difference in the output current between the pair of common outputs of the Nch differential stages 11_1 to 11_N is reduced, and the difference in the output current between the pair of common outputs of the Pch differential stages 12_1 to 12_N is also reduced. Thus, the potential of each node of the current mirrors 30 and 40 and the floating current supply circuit (161 and 162) and the current of each transistor recover to an equilibrium state. When the output signal voltage VO reaches the weighted average voltage of the input signal voltages VI_1 to VI_N, the output circuit 100_1 becomes a stable output state.

Next, an operation when the weighted average voltage of the input signal voltages VI_1 to VI_N is changed to the side of the power supply terminal E2 (i.e., low voltage side) relative to the output signal voltage VO will be described.

In this case, the operation is opposite to the operation when the weighted average voltage of the input signal voltages VI_1 to VI_N is changed to the side of the power supply terminal E1 (i.e., high voltage side) relative to the output signal voltage VO. That is, the N-channel drive potential is increased at the nodes N1 and N3. In the output amplifier stage 107, the charging current of the Pch transistor 171 from the power supply terminal E3 to the output terminal 2 is decreased, while the discharging current of the Nch transistor 172 from the output terminal 2 to the power supply terminal E4 is increased. Therefore, the output signal voltage VO of the output terminal 2 is reduced. When the output signal voltage VO reaches the weighted average voltage of the input signal voltages VI_1 to VI_N, the output circuit 100_1 becomes a stable output state.

Next, an operation, when using the amplification accelerator circuit 200_1_1 of FIG. 2 as the amplification accelerator circuit 200_1 of FIG. 1, will be described with reference to FIGS. 1 and 2. The operation of the amplification accelerator circuit 200_1 is an additional operation to the normal differential amplification operation of the output circuit 100_1 that is not under the control of the amplification accelerator circuit 200_1.

Both of the current control transistors 251 and 252 illustrated in FIG. 2 are in an off state, during a stable output state, that is, when reaching the so-called equilibrium state in which the output signal voltage VO coincides with the weighted average voltage of the input signal voltages VI_1 to VI_N or slightly varies up and down with respect to the weighted average voltage. Therefore, the amplification accelerator circuit 200_1_1 does not send out the output currents Ia and Ib.

When the weighted average voltage of the input signal voltages VI_1 to VI_N is changed to the side of the power supply terminal E3 (high voltage side) relative to the output signal voltage VO, as described above, the current control transistor 251 is turned on, and the output current Ia (i.e., suction current) is sent out to the output (node N3) of the current mirror 40 of FIG. 1.

Thus, since the output current Ia (sink current) of the amplification accelerator circuit 200_1_1 is added by following an increase in the output current of the current mirror 40 due to the amplification operation of the output circuit 100_1 of FIG. 1, that is, the drain current of the Nch transistor 142, a reduction in the N-channel drive potential is accelerated at the node N3, thus quickly changing the Nch transistor 172 of the output amplifier stage 107 to an off state.

Furthermore, the reduction in the N-channel drive potential at the node N3 causes an increase in the gate-source voltage of the Nch transistor 162 of the second floating current supply circuit 60, thus increasing the drain current. The increase in the drain current of the Nch transistor 162 accelerates a reduction in the P-channel drive potential at the node N1, thus accelerating the charging operation of the output terminal 2 by the Pch transistor 171 of the output amplifier stage 107.

When the output signal voltage VO gets close to the weighted average voltage of the input signal voltages VI_1 to VI_N, the current control transistor 251 of FIG. 2 comes to an off state. The output current Ia is cut off, and the amplification acceleration operation of the amplification accelerator circuit 200_1_1 is stopped.

After that, only the differential amplification operation of the output circuit 100_1 that is not under the control of the amplification accelerator circuit 200_1_1 is performed. When the output signal voltage VO reaches the weighted average voltage of the input signal voltages VI_1 to VI_N, the output circuit 100_1 becomes a stable output state.

On the other hand, when the weighted average voltage of the input signal voltages VI_1 to VI_N is changed to the side of the power supply terminal E2 (low voltage side) relative to the output signal voltage VO, as described above, the current control transistor 252 is turned on, and the output current Ib (source current) is sent out to the node N1 of the current mirror 30.

Thus, since the output current Ib (source current) of the amplification accelerator circuit 200_1_1 is added by following an increase in the output current of the current mirror 30 (the drain current of the Pch transistor 132) due to the amplification operation of the output circuit 100_1 of FIG. 1, an increase in the P-channel drive potential is accelerated at the node N1, thus quickly changing the Pch transistor 171 of the output amplifier stage 107 to an off state.

Furthermore, the increase in the P-channel drive potential at the node N1 causes an increase in the gate-source voltage (absolute value) of the Pch transistor 161 of the second floating current supply circuit 60, thus increasing the drain current (absolute value) of the Pch transistor 161. Thus, an increase in the N-channel drive potential at the node N3 is accelerated, thus accelerating the discharging operation of the output terminal 2 by the Nch transistor 172 of the output amplifier stage 107.

When the output signal voltage VO gets close to the weighted average voltage of the input signal voltages VI_1 to VI_N, the current control transistor 252 comes to an off state. The output current Ib is cut off, and the amplification acceleration operation of the amplification accelerator circuit 200_1_1 is stopped.

After that, only the differential amplification operation of the output circuit 100_1 that is not under the control of the amplification accelerator circuit 200_1_1 is performed. When the output signal voltage VO reaches the weighted average voltage of the input signal voltages VI_1 to VI_N, the output circuit 100_1 becomes a stable output state.

Note that the voltages of the nodes N42 and N32, that is, the voltages of the gates of the current control transistors 251 and 252 are set at the voltages of the power supply terminals E4 and E3, respectively, so that both of the current control transistors 251 and 252 are in an off state in the stable output state in which the output signal voltage VO is equal to the weighted average voltage of the input signal voltages VI_1 to VI_N.

Therefore, the amplification acceleration operation of the amplification accelerator circuit 200_1_1 is stopped in the range of having a sufficiently small potential difference between the weighted average voltage of the input signal voltages VI_1 to VI_N and the output signal voltage VO, immediately before one of the nodes N32 and N42 varies and one of the current control transistors 251 and 252 changes from an off state to an on state.

As described above, when the input signal voltages VI_1 to VI_N vary and the weighted average voltage of the input signal voltages VI_1 to VI_N is changed to the high voltage side relative to the output signal voltage VO, the amplification accelerator circuit 200_1_1 adds the output current Ia to the output current of the current mirror 40. Thus, after the Nch transistor 172 of the output amplifier stage 107 is quickly changed to the off state, the charging operation of the output terminal 2 by the Pch transistor 171 is accelerated.

On the other hand, when the weighted average voltage of the input signal voltages VI_1 to VI_N is changed to the low voltage side relative to the output signal voltage VO, the amplification accelerator circuit 200_1_1 adds the output current Ib to the output current of the current mirror 30. Thus, after the Pch transistor 171 of the output amplifier stage 107 is quickly changed to the off state, the discharging operation of the output terminal 2 by the Nch transistor 172 is accelerated.

As described above, in the output circuit 100_1 illustrated in FIG. 1, the output currents Ia and Ib for amplification acceleration generated by the amplification accelerator circuit 200_1 are sent out to the nodes (N1 and N3) on the output side of the current mirrors 30 and 40, which drive the Pch transistor 171 and the Nch transistor 172 of the output amplifier stage 107, respectively.

Therefore, when driving panel data line loads by the output circuit 100_1 of FIG. 1 in short cycles of one data period, even if the operation of the output circuit 100_1 does not return to a stable output state, the amplification accelerator circuit 200_1 is operated by following variations in the input signal voltages VI_1 to VI_N of every data period, thus allowing quickly changing the states of the Pch output transistor 171 and the Nch output transistor 172. That is, the output circuit 100_1 illustrated in FIG. 1 has the functions of quickly changing the Nch output transistor 172 to an off state or the like during the charging operation of the data line loads connected to the output terminal 2, and quickly changing the Pch output transistor 171 to an off state during the discharging operation of the data line loads.

Thus, the output circuit 100_1 allows driving the data line loads without a delay by following variations in the input signal voltages VI_1 to VI_N.

Note that the above-described embodiment adopts the amplification accelerator circuit 200_1_1 having the configuration of FIG. 2 as the amplification accelerator circuit 200_1 of FIG. 1, but the amplification accelerator circuit 200_1 is not limited to those having the configuration of FIG. 2.

Figure 3:
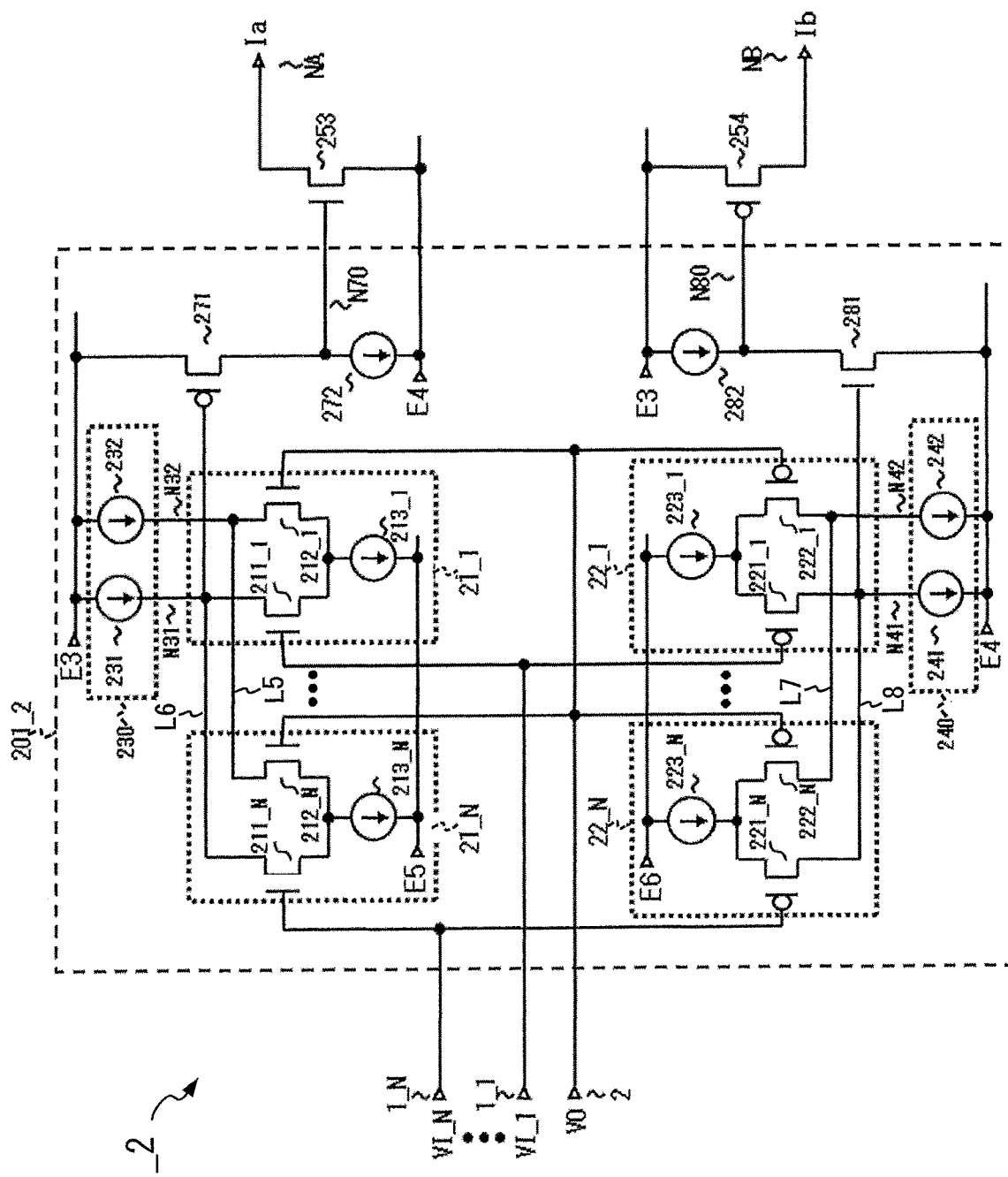
FIG. 3 is a circuit diagram of an amplification accelerator circuit 200_1_2 as a first modification example of the amplification accelerator circuit 200_1_1.

FIG. 3 is a circuit diagram of an amplification accelerator circuit 200_1_2, as a first modification example of the amplification accelerator circuit 200_1_1 of FIG. 2.

The amplification accelerator circuit 200_12 adopts a comparator circuit 201_2 instead of the comparator circuit 201_1 of FIG. 2, and an Nch current control transistor 253 and a Pch current control transistor 254 instead of the Nch current control transistor 251 and the Pch current control transistor 252 of FIG. 2. At this time, in the comparator circuit 201_2 of FIG. 3, a Pch transistor 271 and a load element (current supply) 272 connected in series between the power supply terminals E3 and E4, and an Nch transistor 281 and a load element (current supply) 282 connected in series between the power supply terminals E3 and E4 are added to the configuration of FIG. 2. The other configuration is the same as that of the comparator circuit 201_1 illustrated in FIG. 2. Thus, the description of the same configuration as that of FIG. 2 is omitted.

In FIG. 3, the Pch transistor 271 is connected to the power supply terminal E3 at its source, and connected to the connection point N31 at its gate. The drain (N70) of the Pch transistor 271 is connected to one end of the load element 272, the other end of which is connected to the power supply terminal E4. The Pch transistor 271 and the load element 272 have the function of converting the voltage of the noninverting input side connection point N31 between the common output pair of the Nch differential stages 21_1 to 21_N and the load element pair (231 and 232) from a voltage signal based on the voltage of the power supply terminal E3 into a voltage signal (voltage of N70) based on the voltage of the power supply terminal E4. Note that the drain (N70) of the Pch transistor 271 is connected to the gate of the Nch current control transistor 253, as a first output terminal of the comparator circuit 201_2. The Nch current control transistor 253 is connected to the power supply terminal E4 at its source, and connected to the first output node NA at its drain.

In FIG. 3, the Nch transistor 281 is connected to the power supply terminal E4 at its source, and connected to the connection point N41 at its gate. The drain (N80) of the Nch transistor 281 is connected to one end of the load element 282, the other end of which is connected to the power supply terminal E3. The Nch transistor 281 and the load element 282 have the function of converting the voltage of the noninverting input side connection point N41 between the common output pair of the Pch differential stages 22_1 to 22_N and the load element pair (241 and 242) from a voltage signal based on the voltage of the power supply terminal E4 into a voltage signal (voltage of N80) based on the voltage of the power supply terminal E3. Note that the drain (N80) of the Nch transistor 281 is connected to the gate of the Pch current control transistor 254, as a second output terminal of the comparator circuit 201_2. The Pch current control transistor 254 is connected to the power supply terminal E3 at its source, and connected to the second output node NB at its drain.

According to the above-described configuration, the comparator circuit 201_2 supplies voltages of first and second output terminals, in which a signal corresponding to a comparison result between the weighted average voltage of the input signal voltages VI_1 to VI_N and the output signal voltage VO is converted into voltages based on the voltages of the fourth and third power supply terminals E4 and E3, to the Nch current control transistor 253 and the Pch current control transistor 254, respectively.

When the weighted average voltage of the input signal voltages VI_1 to VI_N are changed to the side of the power supply terminal E3 (i.e., high voltage side) relative to the output signal voltage VO, the voltage of the noninverting input side connection point N31 between the common output pair of the Nch differential stages 21_1 to 21_N and the load element pair (231 and 232) is reduced. Thus, the Pch transistor 271 is turned on and causes a rise in the voltage of the node N70. Therefore, the Nch current control transistor 253 is turned on, and an output current Ia (suction current) is outputted from the output node NA of the amplification accelerator circuit 200_1_2.

It is noted that in a stable output state, both of the Pch transistor 271 and the Nch current control transistor 253 are set to an off state.

When the weighted average voltage of the input signal voltages VI_1 to VI_N are changed to the side of the power supply terminal E4 (i.e., low voltage side) relative to the output signal voltage VO, the voltage of the noninverting input side connection point N41 between the common output pair of the Pch differential stages 22_1 to 22_N and the load element pair (241 and 242), is increased. Thus, the Nch transistor 281 is turned on and causes a fall in the voltage of the node N80. Therefore, the Pch current control transistor 254 is turned on, and an output current Ib (source current) is outputted from the output node NB of the amplification accelerator circuit 200_1_2.

It is noted that in a stable output state, both of the Nch transistor 281 and the Pch current control transistor 254 are set to an off state.

As described above, in the amplification accelerator circuit 200_1_2, when the Nch current control transistor 253 is in an on state, the output current Ia (sink current) is outputted from the first output node NA. Therefore, the output current Ia is added to a current on the output side of the current mirror 40 of the output circuit 100_1, in order to accelerate the charging operation of the output terminal 2 of the output circuit 100_1.

When the Pch current control transistor 254 is in an on state, the output current Ib (source current) is outputted from the second output node NB. Therefore, the output current Ib is added to a current on the output side of the current mirror 30 of the output circuit 100_1, in order to accelerate the discharging operation of the output terminal 2 of the output circuit 100_1.

The only difference between the amplification accelerator circuit 200_1_2 of FIG. 3 and the amplification accelerator circuit 200_1_1 of FIG. 2 is that whether the output operation of the output currents Ia and Ib relative to variations in the input signal voltages VI_1 to VI_N depend on the operation of the Pch differential stages 22_1 to 22_N or the Nch differential stages 21_1 to 21_N. As the amplification accelerator circuit, the output operation of the output currents Ia and Ib relative to variations in the input signal voltages VI_1 to VI_N is the same between the amplification accelerator circuits 200_1_1 and 200_1_2. Thus, the amplification accelerator circuit 200_1_2 has the same operation and effects as the amplification accelerator circuit 200_1_1. Thus, the description of same operation and effects is omitted.

Figure 4:
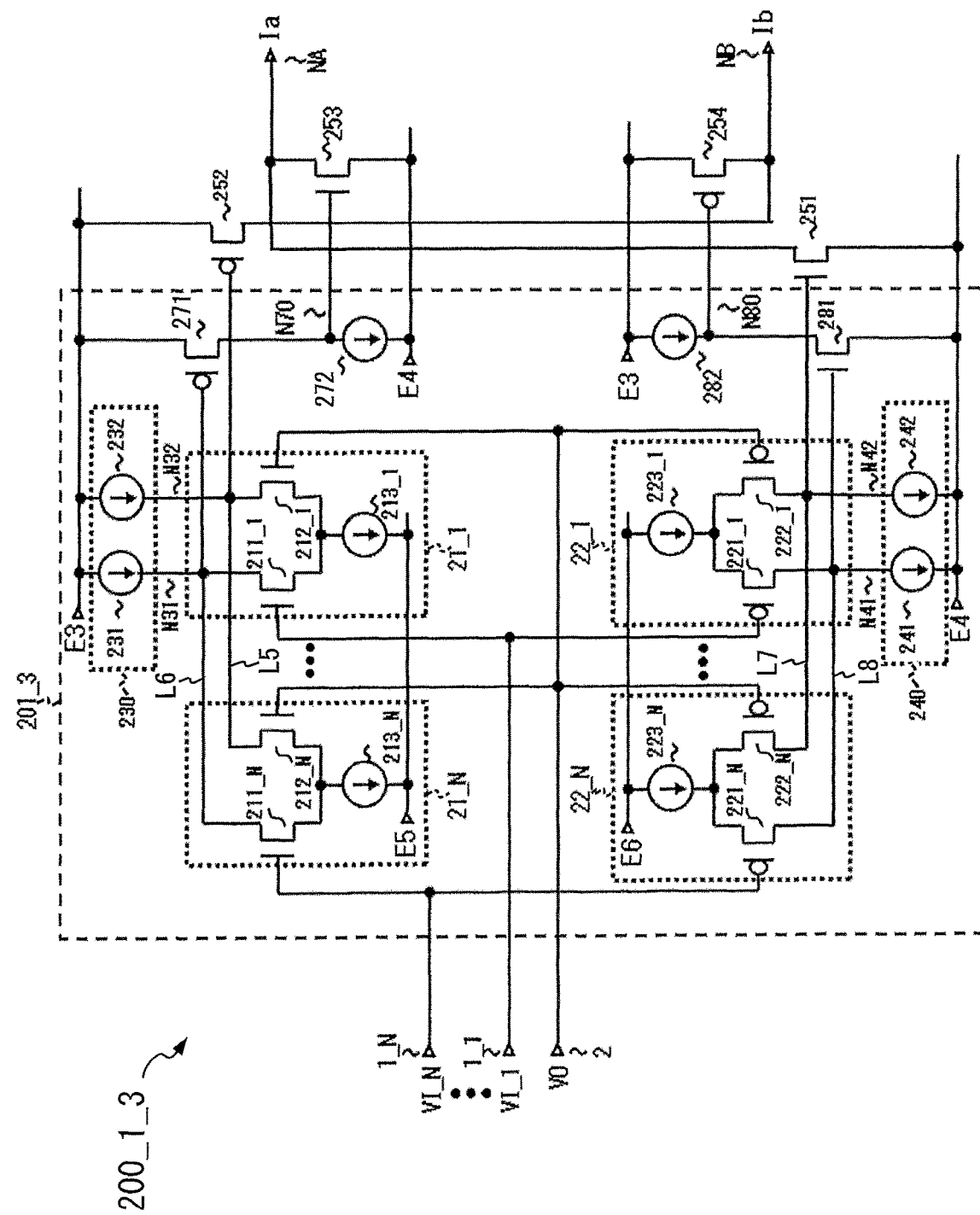
FIG. 4 is a circuit diagram of an amplification accelerator circuit 200_1_3 as a second modification example of the amplification accelerator circuit 200_1_1.

FIG. 4 is a circuit diagram of an amplification accelerator circuit 200_1_3, as a second modification example of the amplification accelerator circuit 200_1_1 of FIG. 2. The amplification accelerator circuit 200_1_3 has a configuration in which the current control transistors 251 and 252 illustrated in FIG. 2 are added to the amplification accelerator circuit 200_1_2 of FIG. 3. The other configuration is the same as that of FIG. 3. Thus, the description of the same configuration as that of FIG. 3 is omitted.

To the output node NA of the amplification accelerator circuit 200_1_3, the drains of the current control transistors 251 and 253 are commonly connected.

Thus, when the weighted average voltage of the input signal voltages VI_1 to VI_N is changed to the side of the power supply terminal E3 (high voltage side) relative to the output signal voltage VO, the current of the current control transistor 251 is outputted from the node NA, on the basis of the voltage of the inverting input side connection point N42 between the common output pair of the Pch differential stages 22_1 to 22_N and the load element pair (241 and 242). Furthermore, the current of the current control transistor 253 is outputted from the node NA, on the basis of the voltage of the noninverting input side connection point N31 between the common output pair of the Nch differential stages 21_1 to 21_N and the load element pair (231 and 232).

On the other hand, to the output node NB of the amplification accelerator circuit 200_1_3, the drains of the current control transistors 252 and 254 are commonly connected.

Thus, when the weighted average voltage of the input signal voltages VI_1 to VI_N is changed to the side of the power supply terminal E4 (low voltage side) relative to the output signal voltage VO, the current of the current control transistor 252 is outputted from the node NB, on the basis of the voltage of the inverting input side connection point N32 between the common output pair of the Nch differential stages 21_1 to 21_N and the load element pair (231 and 232). Furthermore, the current of the current control transistor 254 is outputted from the node NB, on the basis of the voltage of the noninverting input side connection point N41 between the common output pair of the Pch differential stages 22_1 to 22_N and the load element pair (241 and 242).

In the amplification accelerator circuit 200_1_3, when the Nch current control transistors 251 and 253 are in an on state, the output current Ia (sink current) is outputted to the first output node NA. Therefore, the output current Ia is added to a current on the output side of the current mirror 40 of the output circuit 100_1, in order to accelerate the charging operation of the output terminal 2 of the output circuit 100_1.

When the Pch current control transistors 252 and 254 are in an on state, the output current Ib (source current) is outputted from the second output node NB. Therefore, the output current Ib is added to a current on the output side of the current mirror 30 of the output circuit 100_1, in order to accelerate the discharging operation of the output terminal 2 of the output circuit 100_1.

As described above, in the amplification accelerator circuits 200_1_1 and 200_1_2 illustrated in FIGS. 2 and 3, the output operation of the output currents Ia and Ib relative to variations in the input signal voltages VI_1 to VI_N depend on the operation of the Nch differential stages 21_1 to 21_N or the Pch differential stages 22_1 to 22_N.

On the contrary, in the amplification accelerator circuit 200_1_3 illustrated in FIG. 4, the output operation of the output currents Ia and Ib relative to variations in the input signal voltages VI_1 to VI_N depend on both of the operation of the Nch differential stages 21_1 to 21_N and the operation of the Pch differential stages 22_1 to 22_N. Note that, as the amplification accelerator circuit, the output operation of the output currents Ia and Ib relative to variations in the input signal voltages VI_1 to VI_N is the same as those of the amplification accelerator circuits 200_1_1 and 200_1_2. Thus, the amplification accelerator circuit 200_1_3 has the same operation and effects as the amplification accelerator circuit 200_1_1. Thus, the description of same operation and effects is omitted.

Second Embodiment

Figure 5:
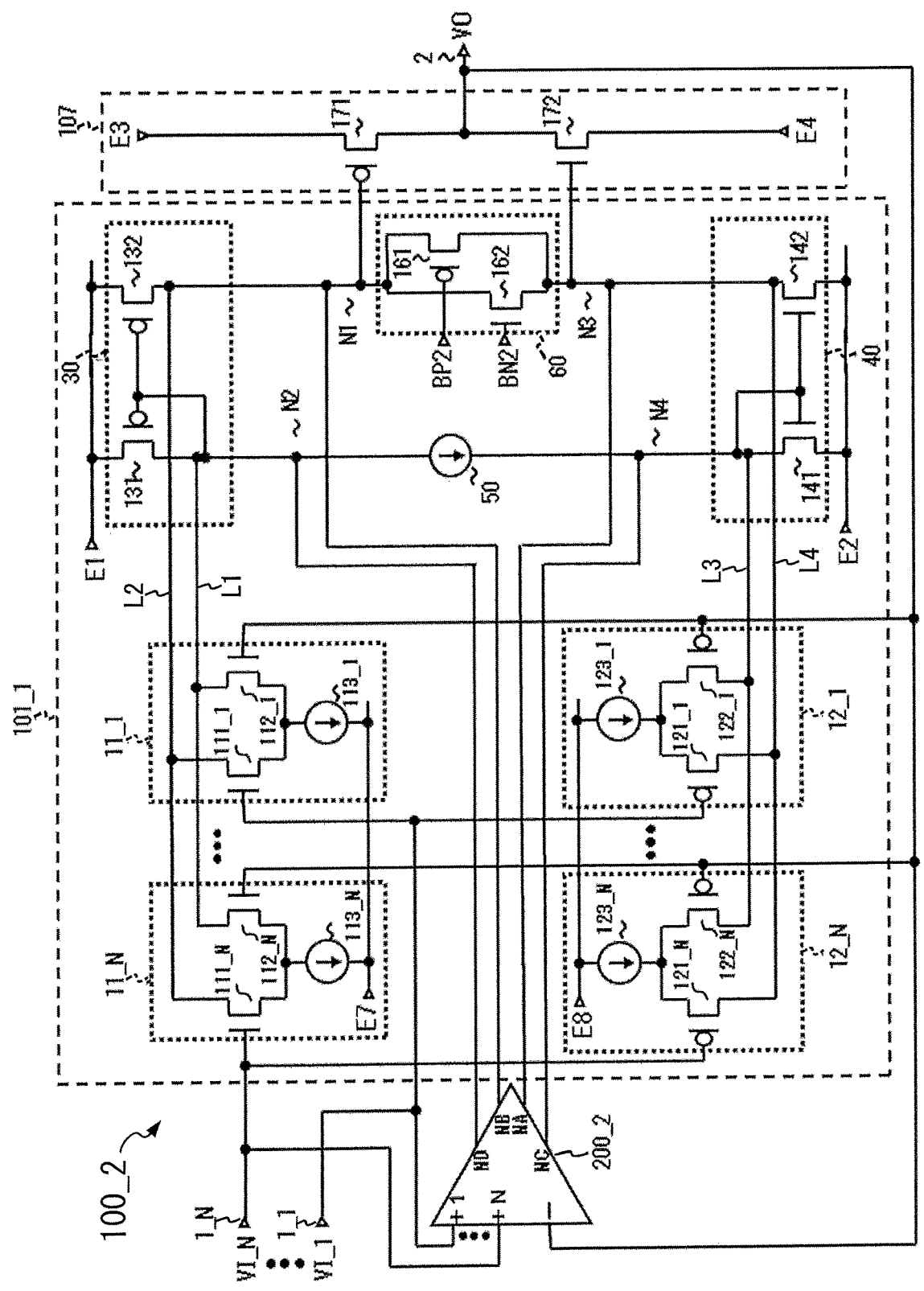
FIG. 5 is a circuit diagram of an output circuit 1002, that is, an output circuit according to a second embodiment as the semiconductor device according to the present invention.

FIG. 5 is a circuit diagram of an output circuit 100_2 according to a second embodiment of the output circuit as the semiconductor device according to the present invention. Note that the output circuit 100_2 illustrated in FIG. 5 adopts an amplification accelerator circuit 200_2 instead of the amplification accelerator circuit 200_1 illustrated in FIG. 1. The other configuration of the output circuit 100_2 is the same as that of FIG. 1. Thus, the description of the same configuration as that of FIG. 1 is omitted.

The amplification accelerator circuit 200_2 includes four output nodes NA, NB, NC, and ND, as first to fourth output nodes. The amplification accelerator circuit 200_2 first performs a comparison between the weighted average voltage of the first to Nth input signal voltages VI_1 to VI_N and the output signal voltage VO.

At this time, when the output signal voltage VO is higher than the weighted average voltage of the first to Nth input signal voltages VI_1 to VI_N, the amplification accelerator circuit 200_2 outputs an output current Ia as a sink current from the output node NA. Thus, the output current Ia is added to the output current of the Nch current mirror 40 of the output circuit, and therefore accelerates the charging operation of the output terminal 2 of the output circuit 100_2. Furthermore, the amplification accelerator circuit 200_2 outputs an output current Ic as a source current from the output node NC. Thus, the output current Ic is added to the input current of the Nch current mirror 40 of the output circuit. When the output current Ic is added to the input current of the Nch current mirror 40, the output current of the Nch current mirror 40 is accordingly increased, thus accelerating the charging operation of the output terminal 2, as in the case of the output current Ia.

It is noted that when the output signal voltage VO is higher than the weighted average voltage of the first to Nth input signal voltages VI_1 to VI_N, the amplification accelerator circuit 200_2 does not output currents from the output nodes NB and ND.

On the other hand, when the output signal voltage VO is lower than the weighted average voltage of the first to Nth input signal voltages VI_1 to VI_N, the amplification accelerator circuit 200_2 outputs an output current Ib as a source current from the output node NB. Thus, the output current Ib is added to the output current of the Pch current mirror 30 of the output circuit, and therefore accelerates the discharging operation of the output terminal 2 of the output circuit 100_2. Furthermore, the amplification accelerator circuit 200_2 outputs an output current Id as a sink current from the output node ND. Thus, the output current Id is added to the input current of the Pch current mirror 30 of the output circuit. At this time, the output current of the Pch current mirror 30 is accordingly increased, thus accelerating the discharging operation of the output terminal 2, as in the case of the output current Ib.

It is noted that when the output signal voltage VO is lower than the weighted average voltage of the first to Nth input signal voltages VI_1 to VI_N, the amplification accelerator circuit 200_2 does not output currents from the output nodes NA and NC.

When the output signal voltage VO is equal to the weighted average voltage of the first to Nth input signal voltages VI_1 to VI_N, the amplification accelerator circuit 200_2 does not output any of the output currents Ia, Ib, Ic, and Id.

Figure 6:
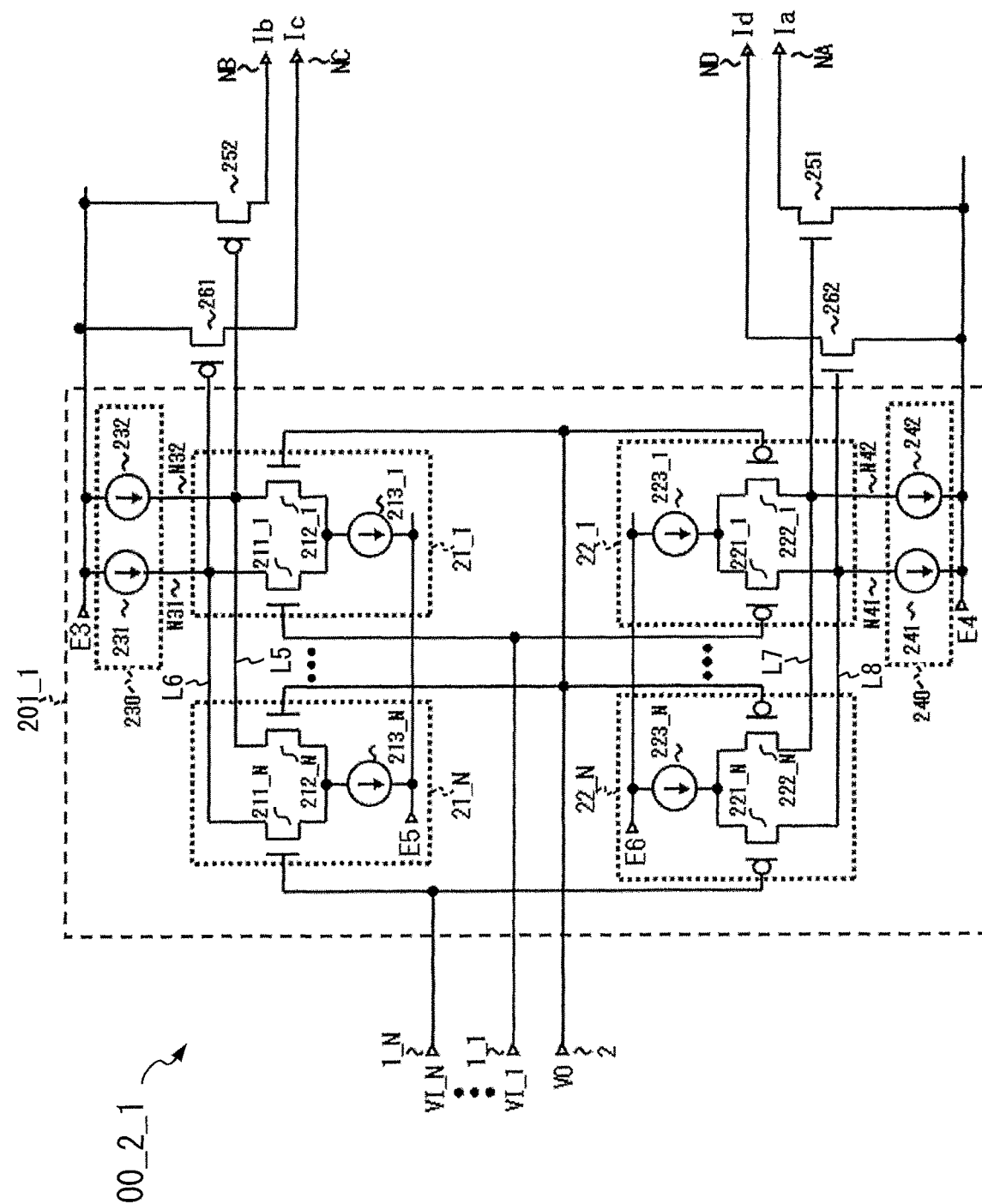
FIG. 6 is a circuit diagram of an amplification accelerator circuit 200_2_1 as an example of an amplification accelerator circuit 200_2.

FIG. 6 is a circuit diagram of an amplification accelerator circuit 200_2_1, as an example of the amplification accelerator circuit 200_2 illustrated in FIG. 5. In the amplification accelerator circuit 200_2_1, output nodes NC and ND and current control transistors 261 and 262 are added to the amplification accelerator circuit 200_1_1 illustrated in FIG. 2. The other configuration is the same as that of FIG. 2. The description of the same configuration as FIG. 2 is omitted.

In FIG. 6, the Pch current control transistor 261 is connected to the power supply terminal E3 at its source, and connected to the output node NC at its drain. The control terminal (gate) of the Pch current control transistor 261 is connected to the noninverting input side connection point N31 between the common output pair of the Nch differential stages 21_1 to 21_N and the load element pair (231 and 232), that is, a third output terminal of the comparator circuit 201_1.

The Nch current control transistor 262 is connected to the power supply terminal E4 at its source, and connected to the output node ND at its drain. The control terminal (gate) of the Nch current control transistor 262 is connected to the noninverting input side connection point N41 between the common output pair of the Pch differential stages 22_1 to 22_N and the load element pair (241 and 242), that is, a fourth output terminal of the comparator circuit 201_1.

In the amplification accelerator circuit 200_2_1, when the weighted average voltage of the input signal voltages VI_1 to VI_N is changed to the side of the power supply terminal E3 (high voltage side) relative to the output signal voltage VO, the voltage of the noninverting input side connection point N31 between the common output pair of the Nch differential stages 21_1 to 21_N and the load element pair (231 and 232) is reduced from the voltage of the power supply terminal E3. Thus, the Pch current control transistor 261 is turned on, and a source current Ic is outputted from the output node NC. Also, the voltage of the inverting input side connection point N42 between the common output pair of the Pch differential stages 22_1 to 22_N and the load element pair (241 and 242), that is, the first output terminal of the comparator circuit 201_1 is increased from the voltage of the power supply terminal E4. Thus, the Nch current control transistor 251 is turned on, and a sink current Ia is outputted from the output node NA. It is noted that, at this time, the current control transistors 252 and 262 are kept in an off state.

On the other hand, when the weighted average voltage of the input signal voltages VI_1 to VI_N is changed to the side of the power supply terminal E4 (low voltage side) relative to the output signal voltage VO, the voltage of the inverting input side connection point N32 between the common output pair of the Nch differential stages 21_1 to 21_N and the load element pair (231 and 232), that is, the second output terminal of the comparator circuit 201_1 is reduced from the voltage of the power supply terminal E3. Thus, the Pch current control transistor 252 is turned on, and a source current Ib is outputted from the output node NB. Also, the voltage of the noninverting input side connection point N41 between the common output pair of the Pch differential stages 22_1 to 22_N and the load element pair (241 and 242) is increased from the voltage of the power supply terminal E4. Thus, the Nch current control transistor 262 is turned on, and a sink current Id is outputted from the output node ND. It is noted that, at this time, the current control transistors 251 and 261 are kept in an off state.

As described above, when the current control transistors 251 and 261 are in an on state, the amplification accelerator circuit 200_2_1 adds the sink current Ia outputted from the output node NA to a current on the output side of the current mirror 40 of the output circuit 1002 (coupling at the node N3). Furthermore, the amplification accelerator circuit 200_2_1 adds the source current Ic outputted from the output node NC to a current on the input side of the current mirror 40 of the output circuit 1002 (coupling at the node N4). At this time, a current on the output side of the current mirror 40 is also increased, and, just as with the current Ia, accelerates the charging operation of the output terminal 2 of the output circuit 100_2.

On the other hand, when the current control transistors 252 and 262 are in an on state, the amplification accelerator circuit 200_2_1 adds the source current Ib outputted from the output node NB to a current on the output side of the current mirror 30 of the output circuit 1002 (coupling at the output node N1). Furthermore, the amplification accelerator circuit 200_2_1 adds the sink current Id outputted from the output node ND to a current on the input side of the current mirror 30 of the output circuit 1002 (coupling at the output node N2). At this time, a current on the output side of the current mirror 30 is also increased, and, just as with the current Ib, accelerates the discharging operation of the output terminal 2 of the output circuit 100_2.

The output circuit 1002 of FIG. 5 that includes the amplification accelerator circuit 200_2 having the above-described configuration is characterized in that the output signal sent out of the amplification accelerator circuit 200_2 is added to the current on the input side of the current mirrors 30 and 40, as well as to the current on the output side of the current mirrors 30 and 40, in order to accelerate the charging operation or the discharging operation of the output terminal of the output circuit 1002.

Third Embodiment

Figure 7:
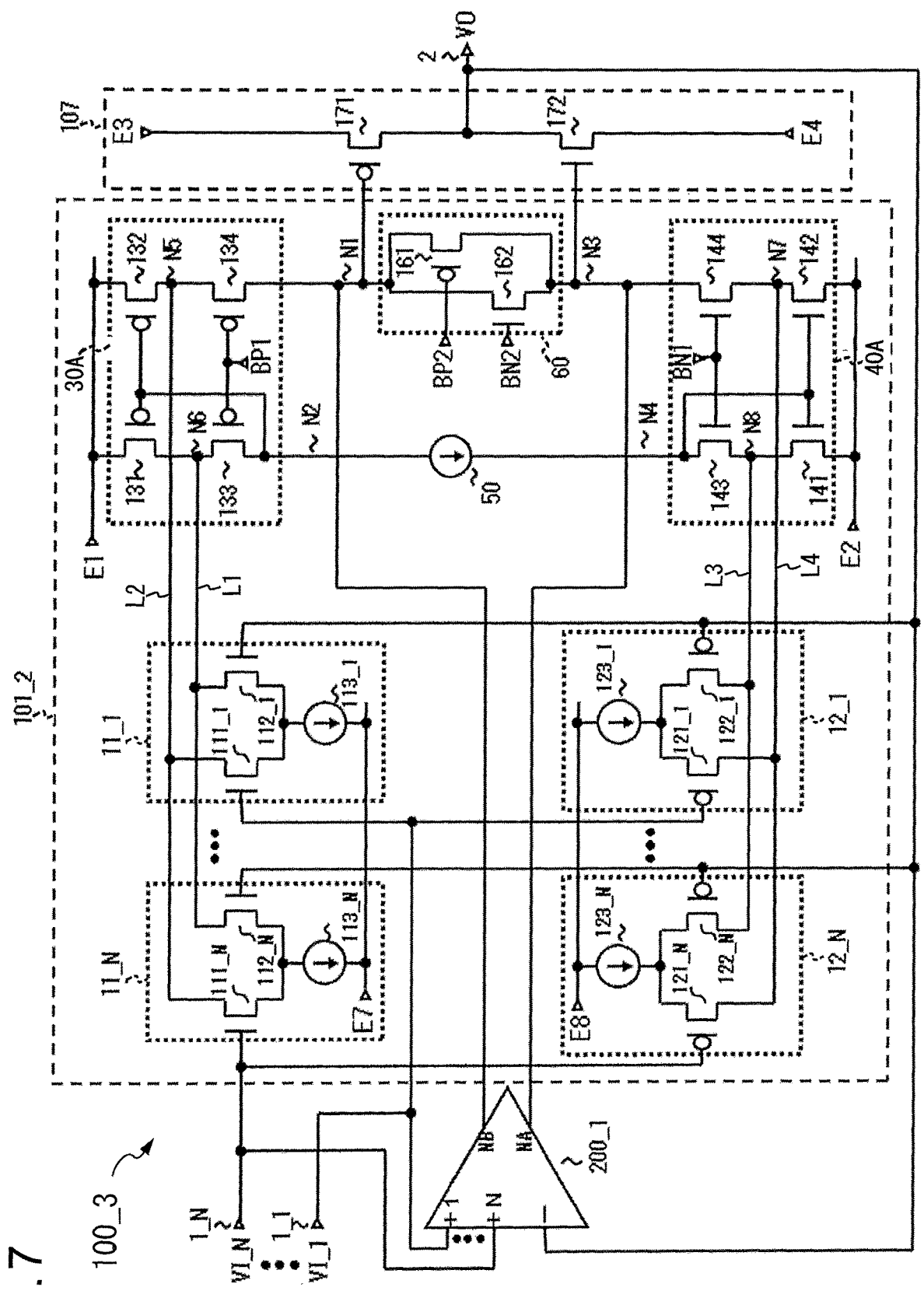
FIG. 7 is a circuit diagram of an output circuit 100_3, that is, an output circuit according to a third embodiment as the semiconductor device according to the present invention.

FIG. 7 is a circuit diagram of an output circuit 100_3 according to a third embodiment of the output circuit as the semiconductor device according to the present invention. Note that the output circuit 100_3 illustrated in FIG. 7 adopts a differential input stage 101_2 instead of the differential input stage 101_1 illustrated in FIG. 1. The other configuration of the output circuit 100_3 is the same as that of FIG. 1. At this time, in the differential input stage 101_2 illustrated in FIG. 7, low voltage cascode current mirrors 30A and 40A are substituted for the current mirrors 30 and 40 of FIG. 1. The configuration of the current mirrors 30A and 40A will next be described. The other configuration is the same as that of the output circuit 100_1 of FIG. 1, so a description thereof is omitted.

The Pch current mirror 30A is constituted of a low voltage cascode current mirror connected between the first power supply terminal E1 and the node pair (N1 and N2). Specifically, the Pch current mirror 30A includes a pair of first-stage Pch transistors (132 and 131) and a pair of second-stage Pch transistors (134 and 133). The pair of first-stage Pch transistors (132 and 131) are connected to each other at their gates, and commonly connected to the power supply terminal E1 at their sources. The gates of the pair of second-stage Pch transistors (134 and 133) are connected to each other and receive a bias voltage BP1. The sources of the pair of second-stage Pch transistors (134 and 133) are connected to the drains of the pair of first-stage Pch transistors (132 and 131), respectively. The drains of the pair of second-stage Pch transistors (134 and 133) are connected to the pair of nodes (N1 and N2), respectively.

The common connection gate of the first-stage Pch transistors (132 and 131) is connected to the node N2. The pair of nodes (N1 and N2) constitute an output terminal and an input terminal of the Pch current mirror 30A, respectively.

One of the pair of common outputs of the Nch differential stages 11_1 to 11_N, that is, the common drain (L2) of the Nch transistors 111_1 to 111_N is connected to a connection point (node N5) between the Pch transistors 132 and 134. The other of the pair of common outputs, that is, the common drain (L1) of the Nch transistors 112_1 to 112_N is connected to a connection point (node N6) between the Pch transistors 131 and 133.

The Nch current mirror 40A is constituted of a low voltage cascode current mirror connected between the power supply terminal E4 and the node pair (N3 and N4). Specifically, the Nch current mirror 40A includes a pair of first-stage Nch transistors (142 and 141) and a pair of second-stage Nch transistors (144 and 143). The pair of first-stage Nch transistors (142 and 141) are connected to each other at their gates, and commonly connected to the power supply terminal E2 at their sources. The gates of the pair of second-stage Nch transistors (144 and 143) are connected to each other and receive a bias voltage BN1. The sources of the pair of second-stage Nch transistors (144 and 143) are connected to the drains of the pair of first-stage Nch transistors (142 and 141), respectively. The drains of the pair of second-stage Nch transistors (144 and 143) are connected to the pair of nodes (N3 and N4), respectively.

The common connection gate of the first-stage Nch transistors (142 and 141) is connected to the node N4. The pair of nodes (N3 and N4) constitute an output terminal and an input terminal of the Nch current mirror 40A, respectively. One of the pair of common outputs of the Pch differential stages 12_1 to 12_N, that is, the common drain (L4) of the Pch transistors 121_1 to 121_N is connected to a connection point (node N7) between the Nch transistors 142 and 144. The other of the pair of common outputs, that is, the common drain (L3) of the Pch transistors 122_1 to 122_N is connected to a connection point (node N8) between the Nch transistors 141 and 143.

In FIG. 7, the output nodes NA and NB of the amplification accelerator circuit 200_1 are connected to the output terminals (nodes N3 and N1) of the current mirrors 40A and 30A, respectively.

The output circuit 100_3 illustrated in FIG. 7 has the same operation as the output circuit 100_1 of FIG. 1, because only the difference is that the low voltage cascode current mirrors 30A and 40A are substituted for the current mirrors 30 and 40 of FIG. 1. That is, just as with the output circuit 100_1 of FIG. 1, the output circuit 100_3 functions as a voltage follower that outputs the weighted average voltage of the input signal voltages VI_1 to VI_N from the output terminal 2. The operation of the output circuit 100_3 will next be described with focus on the effects of adopting the low voltage cascode current mirrors 30A and 40A.

First, an operation when the first to Nth input signal voltages VI_1 to VI_N vary as step voltages and the weighted average voltage of the input signal voltages VI_1 to VI_N is changed to the side of the power supply terminal E3 (high voltage side) relative to the output signal voltage VO of the output terminal 2 will be described.

In this case, the output current of one of the pair of common outputs of the Nch differential stages 11_1 to 11_N, that is, the common drain (L2) of the Nch transistors 111_1 to 111_N is increased, while the output current of the common drain (L1) of the Nch transistors 112_1 to 112_N is decreased. Due to the decrease in the output current of the common drain (L1) of the Nch transistors 112_1 to 112_N, the drain current (absolute value) of the Pch transistor 131 is decreased. This causes a reduction in the drain-source voltage of the Pch transistor 131, that is, the absolute value of the difference voltage between the node N6 and the first power supply terminal E1, while an increase in the gate-source voltage of the Pch transistor 133, that is, the absolute value of the difference voltage between the voltage BP1 and the node N6. Accordingly, the charging operation of the drain (node N2) of the Pch transistor 133 is enhanced. As a result, the potential of the drain (node N2) of the Pch transistor 133 is increased by following the decrease in the drain current (absolute value) of the Pch transistor 131.

Together with the Pch transistor 131, the drain current (absolute value) of the Pch transistor 132 the gate of which is commonly connected to the node N2 is decreased too. At this time, since the output current of one of the pair of common outputs of the Nch differential stages 11_1 to 11_N, that is, the common drain (L2) of the Nch transistors 111_1 to 111_N is increased, the potential of the connection point (node N5) between the Pch transistors 132 and 134 is reduced. Therefore, the gate-source voltage (absolute value) of the Pch transistor 134 is reduced, and the drain current (absolute value) of the Pch transistor 134 supplied to the node N1 is reduced. Thus, the P-channel drive potential of the node N1 is reduced.

Also, since the output current of the other of the pair of common outputs of the Pch differential stages 12_1 to 12_N, that is, the common drain (L3) of the Pch transistors 122_1 to 122_N is increased, the drain current (absolute value) of the Nch transistor 141 is increased. This causes an increase in the drain-source voltage of the Nch transistor 141, that is, the difference voltage between the node N8 and the second power supply terminal E2, while a decrease in the gate-source voltage of the Nch transistor 143, that is, the difference voltage between the voltage BN1 and the node N8. Accordingly, the discharging operation of the drain (node N4) of the Nch transistor 143 is decreased. As a result, the potential of the drain (node N4) of the Nch transistor 143 is increased by following the increase in the drain current (absolute value) of the Nch transistor 141.

Furthermore, the drain current of the Nch transistor 142 the gate of which is connected to the node N4 together with the gate of the Nch transistor 141 is also increased. At this time, since the output current of one of the pair of common outputs of the Pch differential stages 12_1 to 12_N, that is, the common drain (L4) of the Pch transistors 121_1 to 121_N is decreased, the potential of the connection point (node N7) between the Nch transistors 142 and 144 is decreased. Therefore, the gate-source voltage (absolute value) of the Nch transistor 144 is increased, and the drain current of the Nch transistor 144, that is, the sink current to the node N3 is increased. Thus, the N-channel drive potential of the node N3 is reduced.

The reduction in the potentials of the nodes N1 and N3 causes a reduction in the gate potential of the Pch transistor 171 of the output amplifier stage 107. The drain current of the Pch transistor 171, that is, the charging current from the power supply terminal E1 to the output terminal 2 is increased, while the drain current of the Nch transistor 172, that is, the discharging current from the output terminal 2 to the power supply terminal E2 is decreased. Therefore, the output signal voltage VO of the output terminal 2 is increased. At this time, the output signal voltage VO gets close to the weighted average voltage of the input signal voltages VI_1 to VI_N, the difference in the output current between the pair of common outputs of the Nch differential stages 11_1 to 11_N is reduced, and the difference in the output current between the pair of common outputs of the Pch differential stages 12_1 to 12_N is also reduced. Thus, the potential of each node of the current mirrors 30A and 40A and the floating current supply circuit (161 and 162) and the current of each transistor recover to an equilibrium state.

When the output signal voltage VO reaches the weighted average voltage of the input signal voltages VI_1 to VI_N, the output circuit 100_3 becomes a stable output state.

Next, an operation when the weighted average voltage of the input signal voltages VI_1 to VI_N is changed to the side of the power supply terminal E4 (i.e., low voltage side) relative to the output signal voltage VO will be described.

In this case, the operation is opposite to the operation when the weighted average voltage of the input signal voltages VI_1 to VI_N is changed to the side of the power supply terminal E3 (i.e., high voltage side) relative to the output signal voltage VO. That is, the potentials are increased at the nodes N1 and N3, and an increase in the gate potential of the Pch transistor 171 of the output amplifier stage 107 causes a decrease in the drain current thereof, that is, the charging current from the power supply terminal E1 to the output terminal 2. Furthermore, an increase in the gate potential of the Nch transistor 172 causes an increase in the drain current thereof, that is, the discharging current from the output terminal 2 to the power supply terminal E2. Thus, the output signal voltage VO of the output terminal 2 is reduced. When the output signal voltage VO reaches the weighted average voltage of the input signal voltages VI_1 to VI_N, the output circuit 100_3 becomes a stable output state.

In the stable output state, that is, when the output signal voltage VO coincides with the weighted average voltage of the input signal voltages VI_1 to VI_N or slightly varies up and down with respect to the weighted average voltage, in other words, when the amplification accelerator circuit 200_1 is in the equilibrium state, the amplification accelerator circuit 200_1 does not send out output currents Ia and Ib from the output nodes NA and NB.

When the weighted average voltage of the input signal voltages VI_1 to VI_N is changed to the side of the power supply terminal E3 (i.e., high voltage side) relative to the output signal voltage VO, a sink current Ia outputted from the output node NA of the amplification accelerator circuit 200_1 is added to a current on the output side of the current mirror 40A (coupled at the node N3). Thus, since the sink current Ia of the amplification accelerator circuit 200_1 is added to an increase in the output current of the current mirror 40A, that is, the drain currents of the Nch transistors 142 and 144 owing to the amplification operation of the output circuit 100_3 of FIG. 7, a reduction in the N-channel drive potential is accelerated at the node N3, thus quickly changing the Nch transistor 172 of the output amplifier stage 107 to an off state.

Furthermore, the reduction in the N-channel drive potential at the node N3 causes an increase in the gate-source voltage of the Nch transistor 162 of the second floating current supply circuit 60, thus increasing the drain current thereof. Thus, a reduction in the P-channel drive potential is accelerated at the node N1, thus accelerating the charging operation of the output terminal 2 by the Pch transistor 171 of the output amplifier stage 107.

When the output signal voltage VO gets close to the weighted average voltage of the input signal voltages VI_1 to VI_N, the sink current Ia is cut off, and the amplification acceleration operation of the amplification accelerator circuit 200_1 is stopped. After that, only the differential amplification operation of the output circuit 100_3 that is not under the control of the amplification accelerator circuit 200_1 is performed. When the output signal voltage VO reaches the weighted average voltage of the input signal voltages VI_1 to VI_N, the output circuit 100_3 becomes a stable output state.

On the other hand, when the weighted average voltage of the input signal voltages VI_1 to VI_N is changed to the side of the power supply terminal E4 (low voltage side) relative to the output signal voltage VO, a source current Ib outputted from the output node NB of the amplification accelerator circuit 200_1 is added to a current on the output side of the current mirror 30A (coupled at the node N1). Thus, since the source current Ib of the amplification accelerator circuit 200_1 is added to an increase in the output current of the current mirror 30A, that is, the drain currents (absolute values) of the Pch transistors 132 and 134 owing to the amplification operation of the output circuit 100_3 of FIG. 7, an increase in the P-channel drive potential is accelerated at the node N1, thus quickly changing the Pch transistor 171 of the output amplifier stage 107 to an off state. Furthermore, the increase in the P-channel drive potential causes an increase in the gate-source voltage (absolute value) of the Pch transistor 161 of the second floating current supply circuit 60, thus increasing the drain current (absolute value) of the Pch transistor 161. Thus, an increase in the N-channel drive potential is accelerated at the node N3, thus accelerating the discharging operation of the output terminal 2 by the Nch transistor 172 of the output amplifier stage 107.

Note that, when the output signal voltage VO gets close to the weighted average voltage of the input signal voltages VI_1 to VI_N, the source current Ib is cut off, and the amplification acceleration operation of the amplification accelerator circuit 200_1 is stopped. After that, only the differential amplification operation of the output circuit 100_3 that is not under the control of the amplification accelerator circuit 200_1 is performed. When the output signal voltage VO reaches the weighted average voltage of the input signal voltages VI_1 to VI_N, the output circuit 100_3 becomes a stable output state.

As described above, when the input signal voltages VI_1 to VI_N vary and the weighted average voltage of the input signal voltages VI_1 to VI_N is changed to the high voltage side relative to the output signal voltage VO, the amplification accelerator circuit 200_1 adds the sink current Ia to the output current of the current mirror 40A. Thus, after the Nch transistor 172 of the output amplifier stage 107 is quickly turned off, the charging operation of the output terminal 2 by the Pch transistor 171 is accelerated. On the other hand, when the weighted average voltage of the input signal voltages VI_1 to VI_N is changed to the low voltage side relative to the output signal voltage VO, the amplification accelerator circuit 200_1 adds the source current Ib to the output current of the current mirror 30A. Thus, after the Pch transistor 171 of the output amplifier stage 107 is quickly turned off, the discharging operation of the output terminal 2 by the Nch transistor 172 is accelerated.

Therefore, in the output circuit 100_2 illustrated in FIG. 7, just as with the output circuit 100_1 illustrated in FIG. 1, even if the operation of the output circuit 1002 does not return to a stable output state when driving panel data line loads in short cycles of one data period, it is possible to quickly change the states of the Pch output transistor 171 and the Nch output transistor 172 by following variations in the input signal voltages VI_1 to VI_N in accordance with switching of the data period. That is, the output circuit 100_3 has the functions of quickly changing the Nch output transistor 172 to an off state or the like during the charging operation of the data line loads connected to the output terminal 2, and quickly changing the Pch output transistor 171 to an off state during the discharging operation of the data line loads.

Therefore, the output circuit 100_3 illustrated in FIG. 7 allows driving the data line loads without a delay by following variations in the input signal voltages VI_1 to VI_N.

Fourth Embodiment

Figure 8:
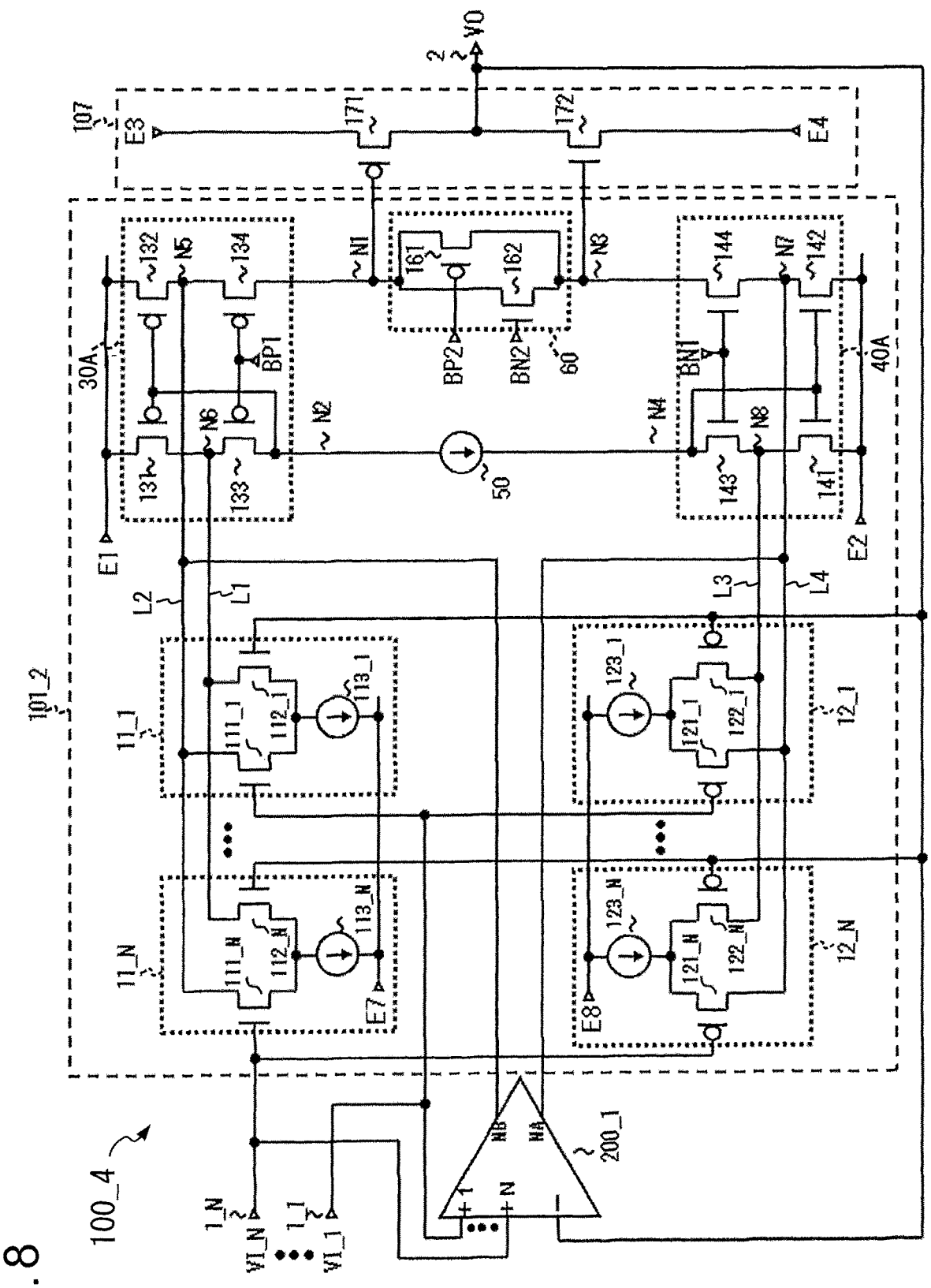
FIG. 8 is a circuit diagram of an output circuit 1004, that is, an output circuit according to a fourth embodiment as the semiconductor device according to the present invention.

FIG. 8 is a circuit diagram of an output circuit 1004 according to a fourth embodiment of the output circuit as the semiconductor device according to the present invention. Note that the output circuit 100_4 illustrated in FIG. 8 is the same as that illustrated in FIG. 7 in configuration and connection, except for the connection between the amplification accelerator circuit 200_1 and the differential input stage 101_2. Specifically, in the output circuit 1004, the output node NA of the amplification accelerator circuit 200_1 is connected to a noninverting input side connection point (node N7) of a pair of connection points between the common output pair of the Pch differential stages 12_1 to 12_N and the current mirror 40A. Furthermore, the output node NB of the amplification accelerator circuit 200_1 is connected to a noninverting input side connection point (node N5) of a pair of connection points between the common output pair of the Nch differential stages 11_1 to 11_N and the current mirror 30A.

Thus, in the output circuit 1004, when the weighted average voltage of the input signal voltages VI_1 to VI_N is changed to the side of the power supply terminal E3 (high voltage side) relative to the output signal voltage VO, a sink current Ia outputted from the output node NA of the amplification accelerator circuit 200_1 is added to a current on the output side of the current mirror 40A. Thus, the sink current Ia of the amplification accelerator circuit 200_1 is added to an increase in the output current of the current mirror 40A, that is, the drain current of the Nch transistor 142 owing to the amplification operation of the output circuit 100_4. Accordingly, a reduction in the potential of the node N7 is accelerated, and the gate-source voltage of the Nch transistor 144 is increased. The drain current of the Nch transistor 144 is increased, thus accelerating a reduction in the N-channel drive potential at the node N3. As a result, the Nch transistor 172 of the output amplifier stage 107 quickly comes to an off state.

Furthermore, due to the operation of the second floating current supply circuit 60, the reduction in the N-channel drive potential at the node N3 accelerates a reduction in the P-channel drive potential at the node N1, thus accelerating the charging operation of the output terminal 2 by the Pch transistor 171 of the output amplifier stage 107.

Note that, when the output signal voltage VO gets close to the weighted average voltage of the input signal voltages VI_1 to VI_N, the sink current Ia is cut off. After that, only the differential amplification operation of the output circuit 1004 that is not under the control of the amplification accelerator circuit 200_1 is performed.

On the other hand, when the weighted average voltage of the input signal voltages VI_1 to VI_N is changed to the side of the power supply terminal E4 (low voltage side) relative to the output signal voltage VO, a source current Ib outputted from the output node NB of the amplification accelerator circuit 200_1 is added to a current on the output side of the current mirror 30A (coupled at the node N5).

Thus, the source current Ib of the amplification accelerator circuit 200_1 is added to an increase in the output current of the current mirror 30A, that is, the drain current (absolute value) of the Pch transistor 132 owing to the amplification operation of the output circuit 100_4 of FIG. 8. Accordingly, an increase in the potential of the node N5 is accelerated, and the gate-source voltage of the Pch transistor 134 is increased. The drain current of the Pch transistor 134 is increased, thus accelerating an increase in the P-channel drive potential at the node N1. As a result, the Pch transistor 171 of the output amplifier stage 107 quickly comes to an off state.

Furthermore, due to the operation of the second floating current supply circuit 60, the increase in the P-channel drive potential at the node N1 accelerates an increase in the N-channel drive potential at the node N3, thus accelerating the discharging operation of the output terminal 2 by the Nch transistor 172 of the output amplifier stage 107.

Note that, when the output signal voltage VO gets close to the weighted average voltage of the input signal voltages VI_to VI_N, the source current Ib is cut off. After that, only the differential amplification operation of the output circuit 100_4 that is not under the control of the amplification accelerator circuit 200_1 is performed.

As described above, the output circuit 100_4 performs the same operation between the case of outputting the sink current Ia outputted from the output node NA of the amplification accelerator circuit 200_1 to the node N7 on the output side of the current mirror 40A and the case of outputting the sink current Ia to the output node N3. Also, the output circuit 1004 performs the same operation between the case of outputting the source current Ib outputted from the output node NB to the node N5 on the output side of the current mirror 30A and the case of outputting the source current Ib to the output node N1. Therefore, the output circuit 1004 of FIG. 8 has the same operation and effects as the output circuit 100_3 of FIG. 7.

Fifth Embodiment

Figure 9:
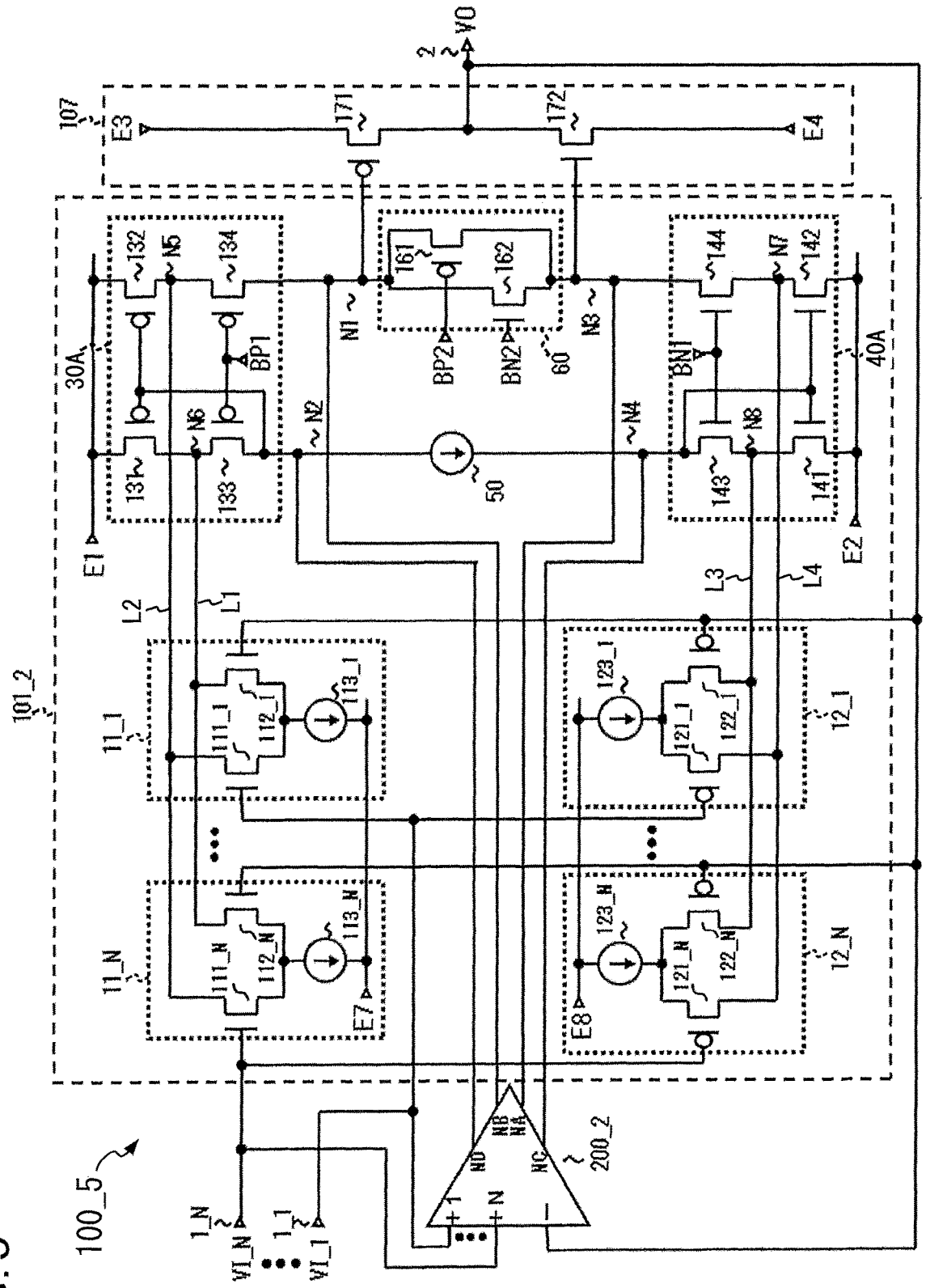
FIG. 9 is a circuit diagram of an output circuit 100_5, that is, an output circuit according to a fifth embodiment as the semiconductor device according to the present invention.

FIG. 9 is a circuit diagram of an output circuit 100_5 according to a fifth embodiment of the output circuit as the semiconductor device according to the present invention. Note that the configuration illustrated in FIG. 9 adopts the differential input stage 1012 instead of the differential input stage 101_1 illustrated in FIG. 5. The other configuration is the same as that of FIG. 5. In other words, the output circuit 100_5 adopts the low voltage cascode current mirrors 30A and 40A, instead of the current mirrors 30 and 40 of FIG. 5.

Figure 10:
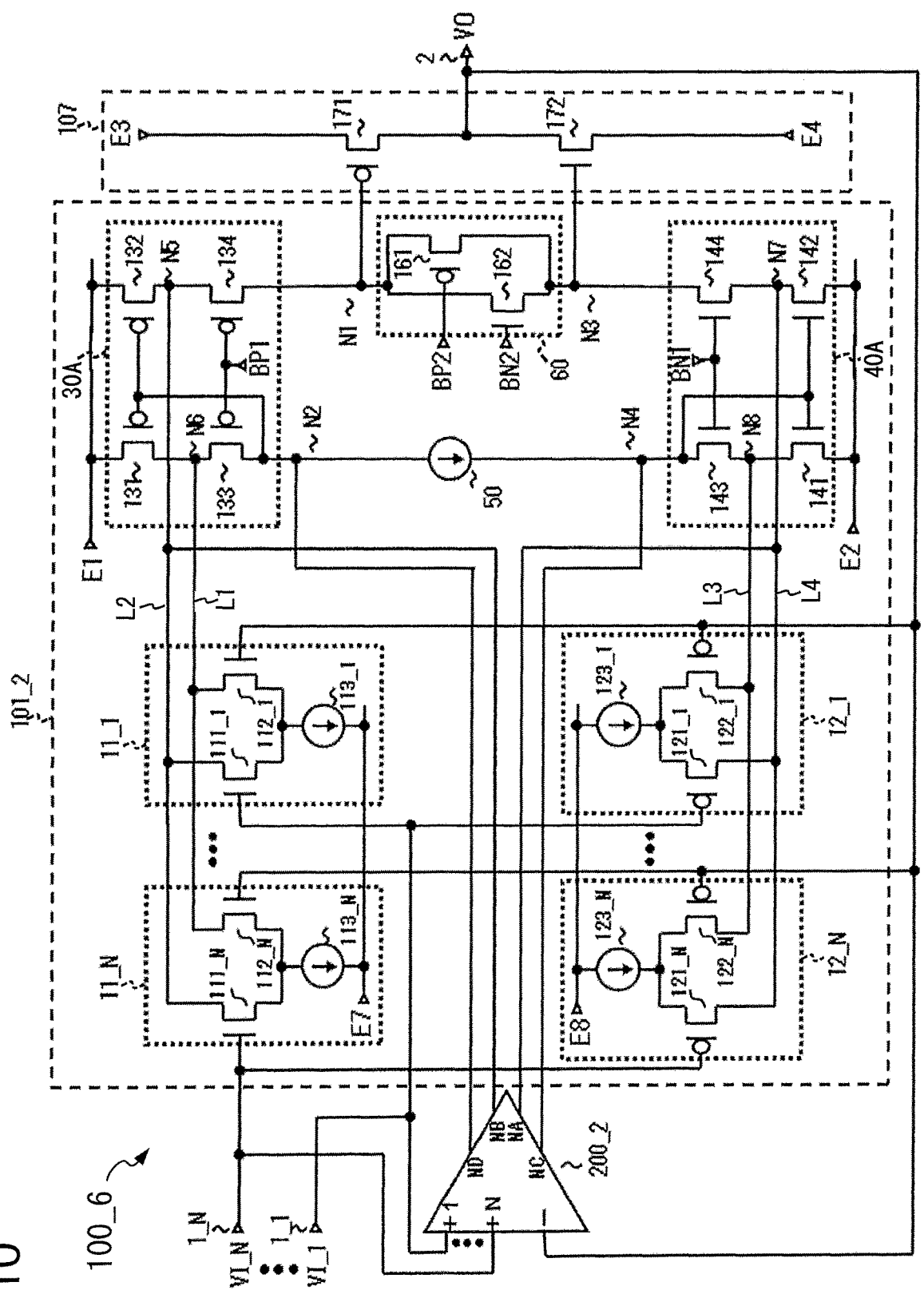
FIG. 10 is a circuit diagram of an output circuit 100_6 as a first modification example of the output circuit 100_5.

FIG. 10 is a circuit diagram of an output circuit 100_6 as a first modification example of the output circuit 100_5 illustrated in FIG. 9. Note that, in the output circuit 100_6, the output node NA of the amplification accelerator circuit 200_2 is connected not to the output node N3 of the current mirror 40A, but to the node N7 on the output side of the current mirror 40A. Furthermore, the output node NB of the amplification accelerator circuit 200_2 is connected not to the output node N1 of the current mirror 30A, but to the node N5 on the output side of the current mirror 30A. The other configuration is the same as that of the output circuit 100_5 illustrated in FIG. 9.

Figure 11:
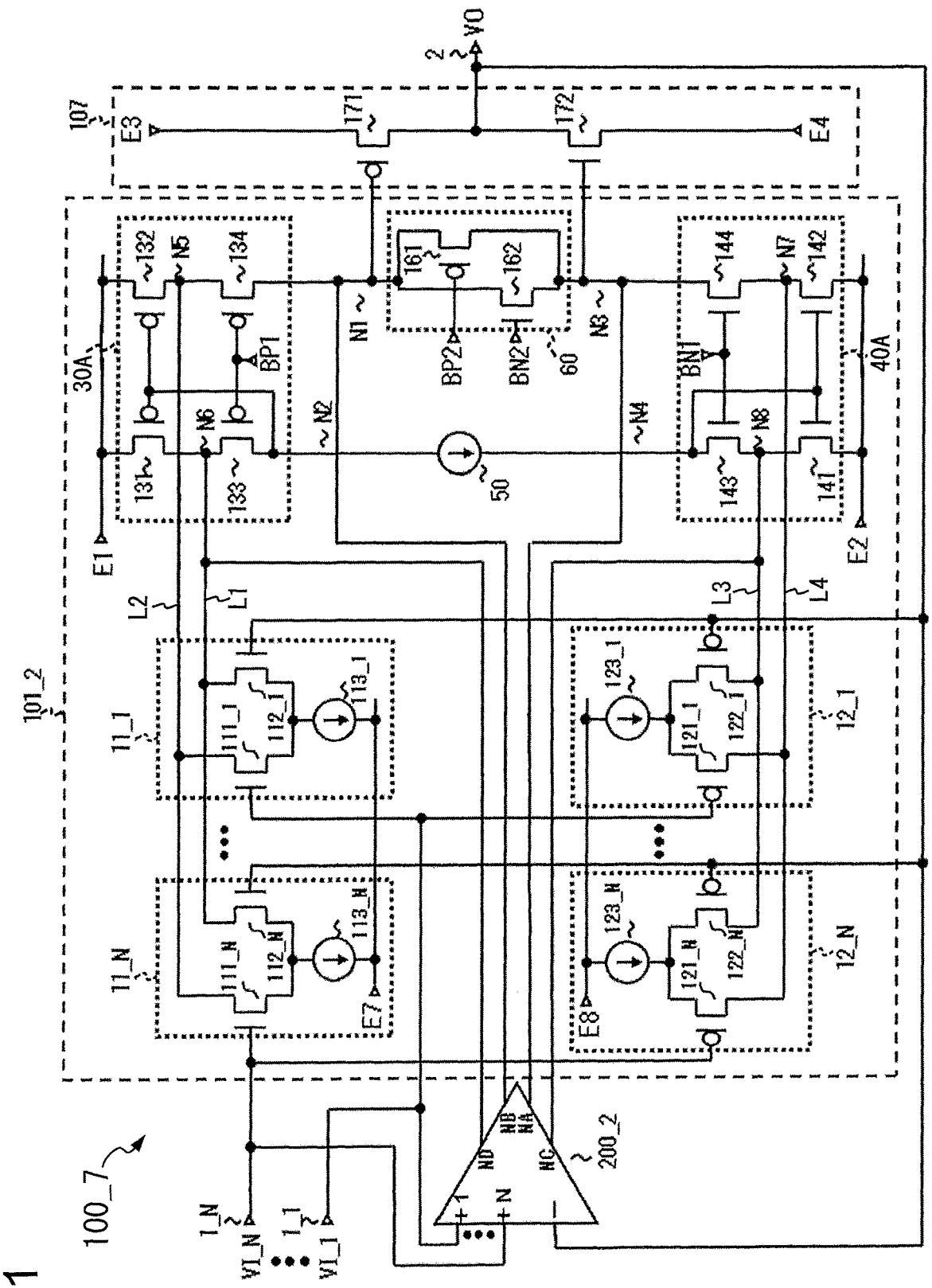
FIG. 11 is a circuit diagram of an output circuit 100_7 as a second modification example of the output circuit 100_5.

FIG. 11 is a circuit diagram of an output circuit 100_7 as a second modification example of the output circuit 100_5 illustrated in FIG. 9. Note that, in the output circuit 100_7, the output node NC of the amplification accelerator circuit 200_2 is connected not to the input node N4 of the current mirror 40A, but to the node N8 on the input side of the current mirror 40A. Furthermore, the output node ND of the amplification accelerator circuit 200_2 is connected not to the input node N2 of the current mirror 30A, but to the node N6 on the input side of the current mirror 30A. The other configuration is the same as that of the output circuit 100_5 illustrated in FIG. 9.

Figure 12:
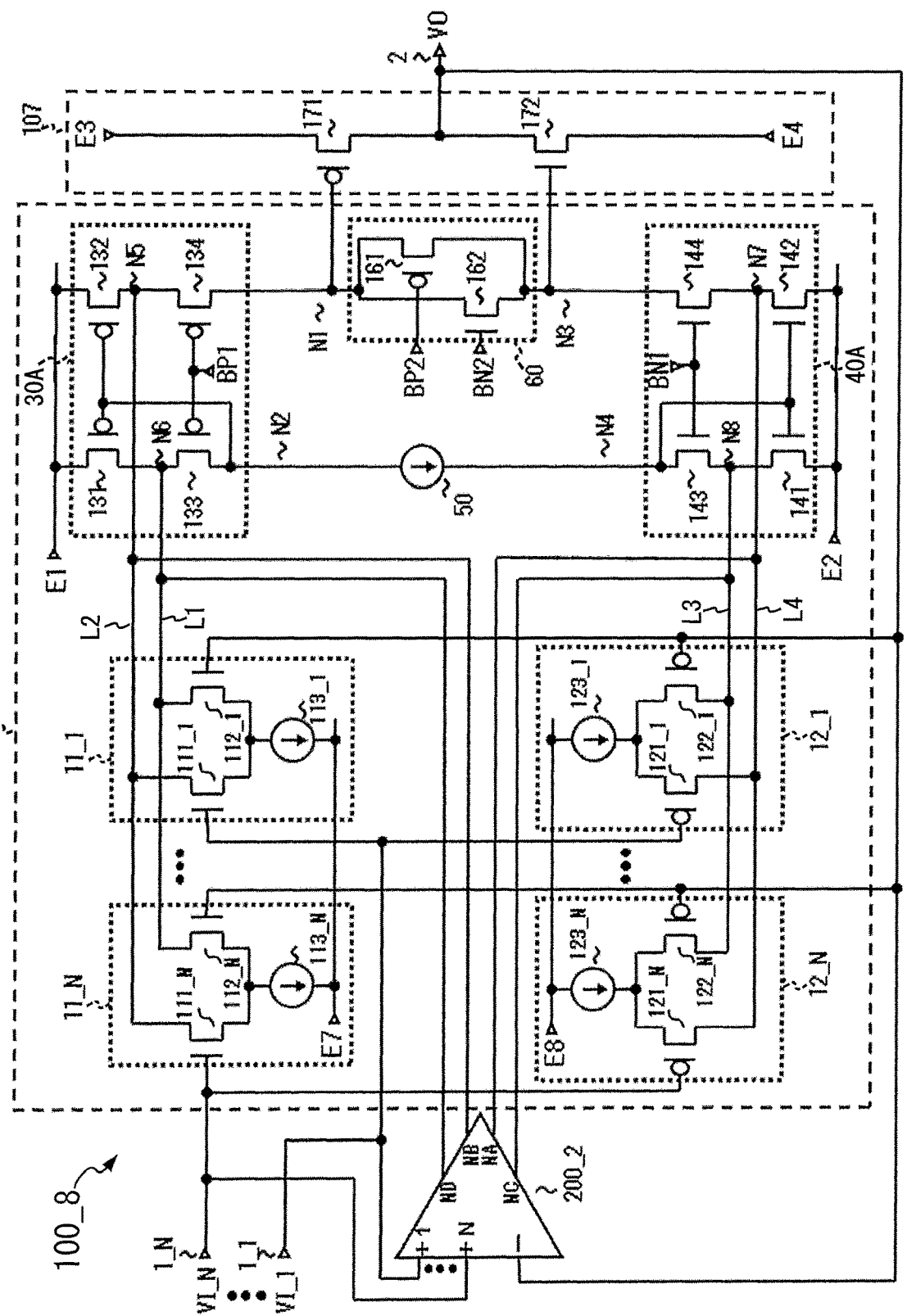
FIG. 12 is a circuit diagram of an output circuit 100_8 as a third modification example of the output circuit 100_5.

FIG. 12 is a circuit diagram of an output circuit 100_8 as a third modification example of the output circuit 100_5 illustrated in FIG. 9. Note that, in the output circuit 100_8, the output node NA of the amplification accelerator circuit 200_2 is connected not to the output node N3 of the current mirror 40A, but to the node N7 on the output side of the current mirror 40A. The output node NC of the amplification accelerator circuit 200_2 is connected not to the input node N4 of the current mirror 40A, but to the node N8 on the input side of the current mirror 40A. Furthermore, in the output circuit 100_8, the output node NB of the amplification accelerator circuit 200_2 is connected not to the output node N1 of the current mirror 30A, but to the node N5 on the output side of the current mirror 30A. The output node ND of the amplification accelerator circuit 200_2 is connected not to the input node N2 of the current mirror 30A, but to the node N6 on the input side of the current mirror 30A. The other configuration is the same as that of the output circuit 100_5 illustrated in FIG. 9.

The amplification accelerator circuit 200_2 performs the same operation as that described in FIG. 5 or 6. The current mirrors 40A and 30A perform the same operation as the current mirrors 40 and 30 described in FIG. 7 or 8. At this time, in the current mirrors 40A and 30A, even if the output node NA of the amplification accelerator circuit 200_2 is connected to either of the nodes N3 and N7 on the output side of the current mirror 40A, the same amplification acceleration operation occurs, as described in FIG. 7 or 8. Even if the output node NB of the amplification accelerator circuit 200_2 is connected to either of the nodes N1 and N5 on the output side of the current mirror 30A, the same amplification acceleration operation occurs. Even if the output node NC of the amplification accelerator circuit 200_2 is connected to either of the nodes N4 and N8 on the input side of the current mirror 40A, the same amplification acceleration operation occurs. Furthermore, even if the output node ND of the amplification accelerator circuit 200_2 is connected to either of the nodes N2 and N6 on the input side of the current mirror 30A, the same amplification acceleration operation occurs.

Therefore, the output circuits 100_5 to 100_8 illustrated in FIGS. 9 to 12 have the same operation and effects as the output circuit 1002 illustrated in FIG. 5.

Figure 13:
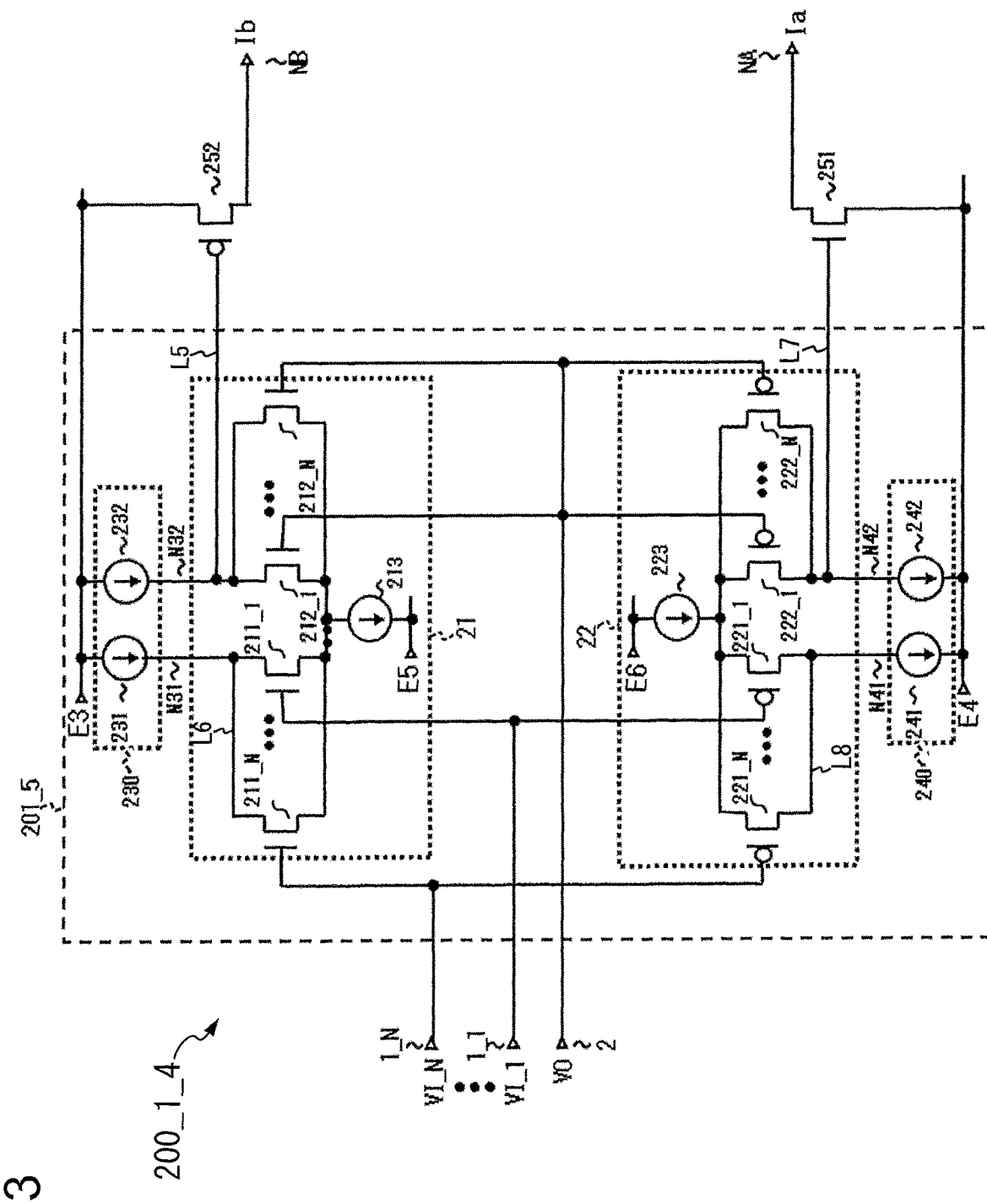
FIG. 13 is a block diagram of an amplification accelerator circuit 200_1_4 as a third modification example of the amplification accelerator circuit 200_1_1.

FIG. 13 is a circuit diagram of an amplification accelerator circuit 200_1_4 as a third modification example of the amplification accelerator circuit 200_1_1 illustrated in FIG. 2. Note that the amplification accelerator circuit 200_1_4 adopts a comparator circuit 201_5 instead of the comparator circuit 201_1 illustrated in FIG. 2, and the other configuration thereof is the same as that of FIG. 2.

In the comparator circuit 201_5 illustrated in FIG. 13, the current supplies 213_1 to 213_N of the Nch differential stages 21_1 to 21_N of FIG. 2 are integrated and substituted by a single current supply 213. The current supplies 223_1 to 223_N of the Pch differential stages 22_1 to 22_N of FIG. 2 are integrated and substituted by a single current supply 223. The other configuration is the same as that of FIG. 2. In other words, in the comparator circuit 201_5, the current supply 213 is commonly used to drive the N number of Nch differential pairs (211_1 and 212_1) to (211_N and 212_N). The current supply 223 is commonly used to drive the N number of Pch differential pairs (221_1 and 222_1) to (221_N and 222_N). Note that the transistors 212_1 to 212_N of the pairs of Nch differential transistors may be added and integrated into one transistor. The transistors 222_1 to 222_N of the pairs of Pch differential transistors may be added and integrated into one transistor.

The operation of the comparator circuit 201_5 including the differential stages described above is the same as that of the comparator circuit 201_1 of FIG. 2. Since the current supplies for driving the N number of pairs of differential stages are integrated in the comparator circuit 201_5, it is possible to reduce the number of elements and the size of a circuit. Note that the comparison circuit illustrated in FIG. 3, 4, or 6 may be substituted by the comparator circuit 201_5 illustrated in FIG. 13.

Figure 14:
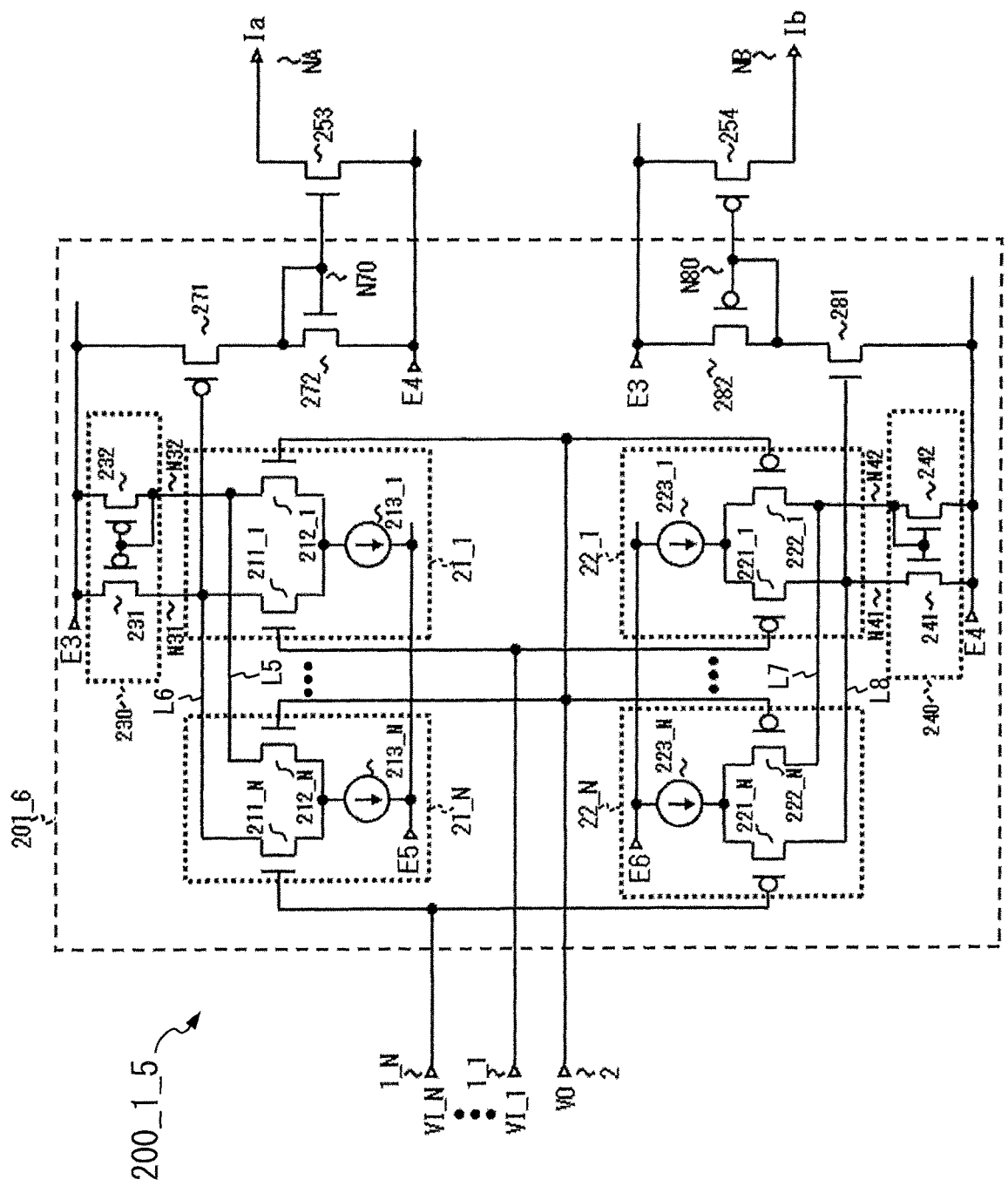
FIG. 14 is a circuit diagram of an amplification accelerator circuit 200_1_5 as a fourth modification example of the amplification accelerator circuit 200_1_1.

FIG. 14 is a circuit diagram of an amplification accelerator circuit 200_1_5 as a fourth modification example of the amplification accelerator circuit 200_1_1 illustrated in FIG. 2. Note that the amplification accelerator circuit 200_1_5 adopts a comparator circuit 201_6 instead of the comparator circuit 2012 illustrated in FIG. 3, and the other configuration thereof is the same as that of FIG. 3.

The comparator circuit 201_6 illustrated in FIG. 14 adopts a Pch current mirror (231 and 232) instead of the current supplies 231 and 232 that constitute the load element pair of the comparator circuit 201_2 illustrated in FIG. 3, and adopts an Nch current mirror (241 and 242) instead of the current supplies 241 and 242 that constitute the load element pair. Furthermore, the comparator circuit 201_6 adopts diode-connected transistors 272 and 282 the drains and gates of which are commonly connected, instead of the current supplies 272 and 282 that constitute the load elements of the comparator circuit 201_2 illustrated in FIG. 3. The other configuration is the same as that of FIG. 3.

Note that the above-described load element (pair) may be substituted by resistor element (pair) or diode (pair). The substitution of the current mirrors for the above-described current supply pair, as the above-described load element pair, may be applied in the same manner to each of the comparator circuits of FIGS. 2 to 4 and 6.

Figure 15:
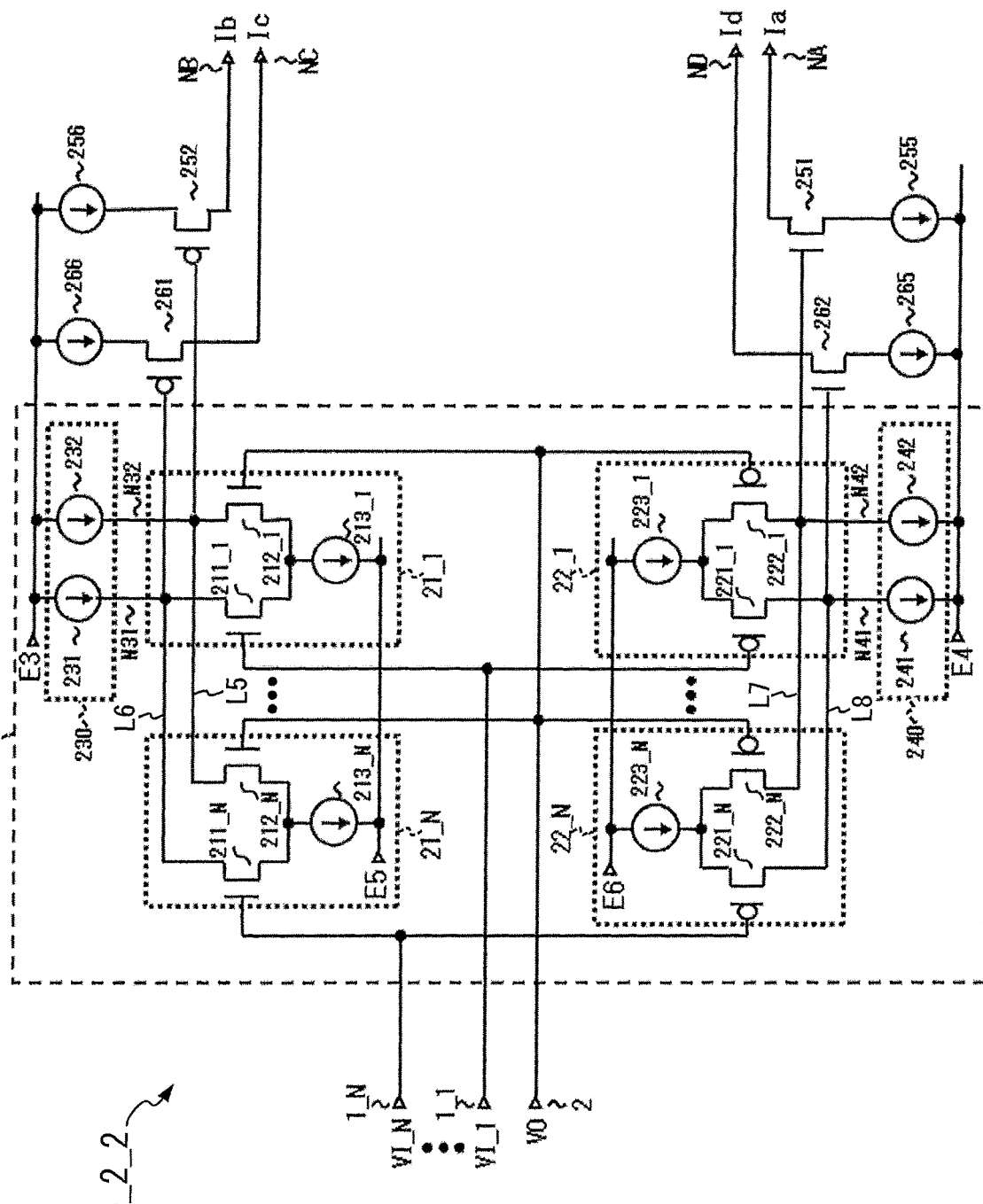
FIG. 15 is a circuit diagram of an amplification accelerator circuit 200_2_2 as a modification example of the amplification accelerator circuit 200_2_1.

FIG. 15 is a circuit diagram of an amplification accelerator circuit 200_2_2 as a modification example of the amplification accelerator circuit 200_2_1 illustrated in FIG. 6. Note that in the amplification accelerator circuit 200_2_2, current supplies 255, 256, 265, and 266 are newly added to the configuration of FIG. 6. The other configuration is the same as that of FIG. 6. In other words, in the amplification accelerator circuit 200_2_2, the current supply 256 is connected between the power supply terminal E3 and the Pch current control transistor 252. The current supply 266 is connected between the power supply terminal E3 and the Pch current control transistor 261. Furthermore, in the amplification accelerator circuit 200_2_2, the current supply 255 is connected between the power supply terminal E4 and the Nch current control transistor 251. The current supply 265 is connected between the power supply terminal E4 and the Nch current control transistor 262. Note that the connection order of the current control transistor and the current source, which are connected in series, may be reversed.

When adopting the configuration of FIG. 15, the current control transistor is turned on by the operation of the amplification accelerator circuit. It becomes possible to set a current upper limit value when a current is sent out from the current control transistor to the output circuit. Thus, it is possible to easily control the amplification acceleration operation of the output circuit by setting the current value of the current supply. Also, the consumption current of the output circuit and the amplification acceleration circuit can be controlled.

The modification of adding the current supplies to the current control transistors, as illustrated in FIG. 15, can be applied in the same manner to the current control transistors of each of the amplification acceleration circuits of FIGS. 2 to 4, 6, 13, and 14, and thereby the above-described effects can be obtained.

The magnitude relationship of power voltages to be applied to the power supply terminals E1, E2, E3, E4, E5, E6, E7, and E8 in each of the above-described embodiments will next be described with reference to FIGS. 16A to 16G.

For example, a data driver for a liquid crystal display unit performs an alternating current drive in which a positive range gradation voltage on a high potential side with respect to a common voltage and a negative range gradation voltage on a low potential side with respect to the common voltage are switched at predetermined intervals. Thus, at least a high power voltage VDD and a low power voltage VSS are applied, and a middle power voltage VDM, which corresponds to the lower limit of a positive range and the upper limit of a negative range, may be additionally applied as a power voltage.

On the other hand, in a data driver for an organic EL display unit, there is no polarity, in contrast to the data driver for the liquid crystal display units, and a high power voltage VDD and a low power voltage VSS are applied as a power voltage.

Thus, for example, when the output circuit 100_1 of FIG. 1 including the amplification accelerator circuit 200_1 (200_1_1 of FIG. 2, 200_1_2 of FIG. 3, or 200_1_3 of FIG. 4) is used as an output circuit of the data driver for the organic EL display unit, a two-level power supply is adopted as illustrated in FIG. 16A. At this time, the high power voltage VDD is applied to the power supply terminals E1, E3, E6, and E8, while the low power voltage VSS is applied to the power supply terminal E2, E4, E5, and E7.

On the other hand, when the output circuit 100_1 of FIG. 1 including the amplification accelerator circuit 200_1 is used as an output circuit of the data driver for the liquid crystal display unit, just as in the case of the data driver for the organic EL display unit, the two-level power supply is also adopted as illustrated in FIG. 16A. At this time, the high power voltage VDD is applied to the power supply terminals E1, E3, E6, and E8, while the low power voltage VSS is applied to the power supply terminal E2, E4, E5, and E7.

When the output circuit 100_1 of FIG. 1 including the amplification accelerator circuit 200_1 is used as an output circuit for driving the positive range of the data driver for the liquid crystal display unit, the two-level power supply, as illustrated in FIG. 16A, may apply the high power voltage VDD to the power supply terminals E1, E3, E6, and E8, while applying the middle power voltage VDM to the power supply terminals E2, E4, E5, and E7. When the output circuit 100_1 of FIG. 1 including the amplification accelerator circuit 200_1 is used as an output circuit for driving the negative range of the data driver for the liquid crystal display unit, the two-level power supply, as illustrated in FIG. 16A, may apply the middle power voltage VDM to the power supply terminals E1, E3, E6, and E8, while applying the low power voltage VSS to the power supply terminals E2, E4, E5, and E7.

When the output circuit 100_1 is used as an output circuit for driving the positive range, for example, a three-level power supply using the high power voltage VDD, the middle power voltage VDM, and the low power voltage VSS may be adopted. At this time, for example, as illustrated in FIG. 16B, the high power voltage VDD may be applied to the power supply terminals E1, E3, E6, and E8, the middle power voltage VDM may be applied to the power supply terminal E4, and the low power voltage VSS may be applied to the power supply terminals E2, E5, and E7. Otherwise, as illustrated in FIG. 16C, the high power voltage VDD may be applied to the power supply terminals E1, E3, E6, and E8, the middle power voltage VDM may be applied to the power supply terminals E4 and E5, and the low power voltage VSS may be applied to the power supply terminals E2 and E7. Otherwise, as illustrated in FIG. 16D, the high power voltage VDD may be applied to the power supply terminals E1, E3, E6, and E8, the middle power voltage VDM may be applied to the power supply terminals E4, E5, and E7, and the low power voltage VSS may be applied to the power supply terminal E2.

In the supply of the power voltage as illustrated in FIGS. 16B to 16D, a reduction in the difference of power voltage between the power supply terminals E3 and E4 of the output amplifier stage 107, in which a large current flows through the output transistor, causes a reduction in consumption power represented by "current×voltage", thus allowing a reduction in a calorific value thereby.

As the output circuit for driving the negative range, a three-level power supply as illustrated in FIG. 16E may be adopted. At this time, the high power voltage VDD may be applied to the power supply terminals E1, E6, and E8, the middle power voltage VDM may be applied to the power supply terminal E3, and the low power voltage VSS may be applied to the power supply terminals E2, E4, E5, and E7. Otherwise, a three-level power supply as illustrated in FIG. 16F may be adopted. At this time, the high power voltage VDD may be applied to the power supply terminals E1 and E8, the middle power voltage VDM may be applied to the power supply terminals E3 and E6, and the low power voltage VSS may be applied to the power supply terminals E2, E4, E5, and E7. Otherwise, a three-level power supply as illustrated in FIG. 16G may be adopted. That is, the high power voltage VDD may be applied to the power supply terminal E8, the middle power voltage VDM may be applied to the power supply terminals E1, E3, and E6, and the low power voltage VSS may be applied to the power supply terminals E2, E4, E5, and E7.

In the supply of the power voltage as illustrated in FIGS. 16E to 16G a reduction in the difference of power voltage between the power supply terminals E3 and E4 of the output amplifier stage 107, in which a large current flows through the output transistor, causes a reduction in consumption power represented by "current×voltage", thus allowing a reduction in a calorific value thereby.

Figure 17:
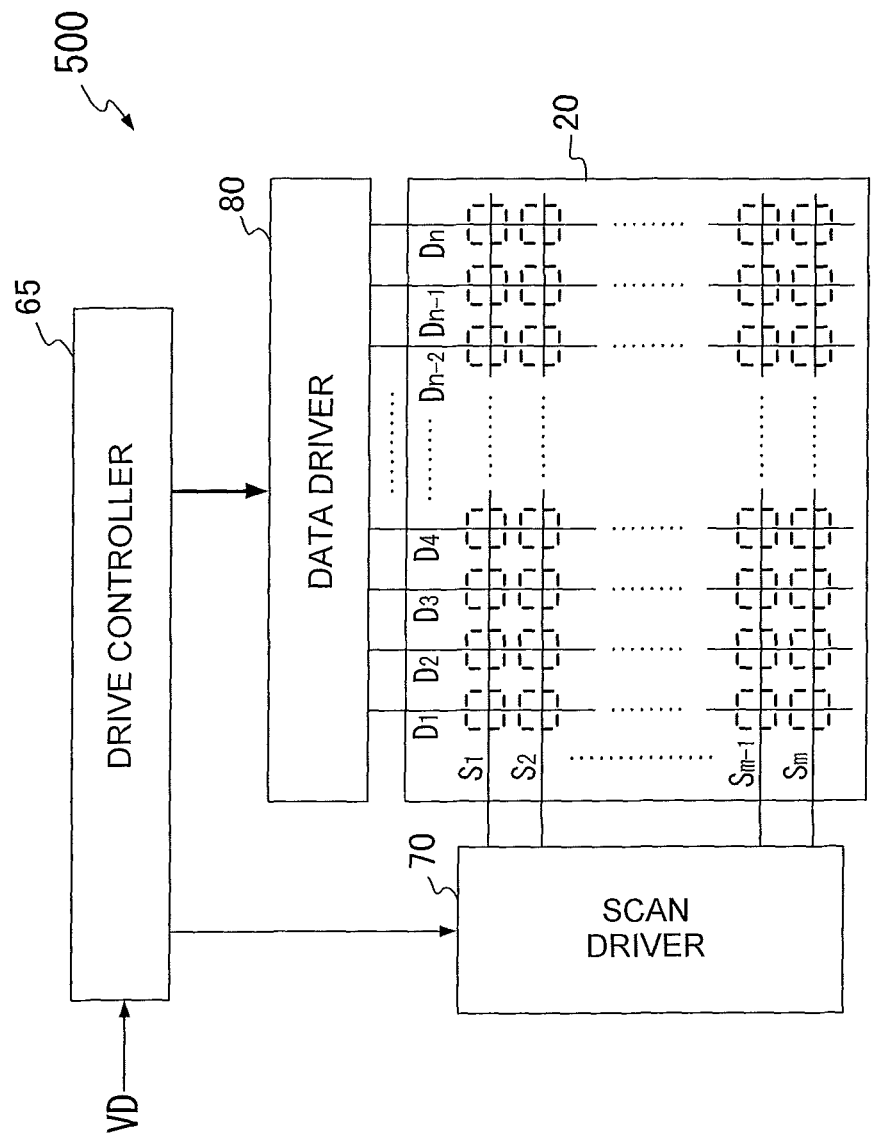
FIG. 17 is a block diagram illustrating the schematic configuration of a display unit 500 including a data driver 80 having output circuits (100_1 to 100_8) formed therein.

FIG. 17 is a block diagram of the schematic configuration of a display unit 500 including a data driver 80 having the above-described output circuits (100_1 to 100_8) formed therein. Referring to FIG. 17, in a display device 20 constituted of, for example, a liquid crystal panel, an organic EL panel, or the like, an m (m is a natural number of 2 or more) number of horizontal scan lines $S_1$ to $S_m$ extending in a horizontal direction of a two-dimensional screen and an n (n is a natural number of 2 or more) number of data lines $D_1$ to $D_n$ extending in a vertical direction of the two-dimensional screen are formed. A display cell constituting a pixel is formed at each of intersections of the horizontal scan lines and the data lines.

A drive controller 65 detects a horizontal synchronous signal from a video signal VD, and supplies the horizontal synchronous signal to a scan driver 70. The drive controller 65 generates various control signals and a series of pixel data PD, which represents the brightness level of each pixel as a brightness scale of e.g. 8 bits, based on the video signal VD, and outputs the various control signals and the series of pixel data PD to the data driver 80.

The scan driver 70 sequentially applies a horizontal scan pulse SP to each of the horizontal scan lines $S_1$ to $S_m$ of the display device 20 in synchronization with the horizontal synchronous signal supplied from the drive controller 65.

The data driver 80 is formed in a semiconductor device such as an LSI (large scale integrated circuit). The data driver 80 converts the pixel data PD supplied from the drive controller 65 into gradation voltage signals $G_1$ to $G_n$ having gradation voltages corresponding to data PD of each pixel, on a basis of one horizontal scan line, i.e., every n pixels. The data driver 80 applies the gradation voltage signals $G_1$ to $G_n$ to the data lines $D_1$ to $D_n$ of the display device 20.

Figure 18:
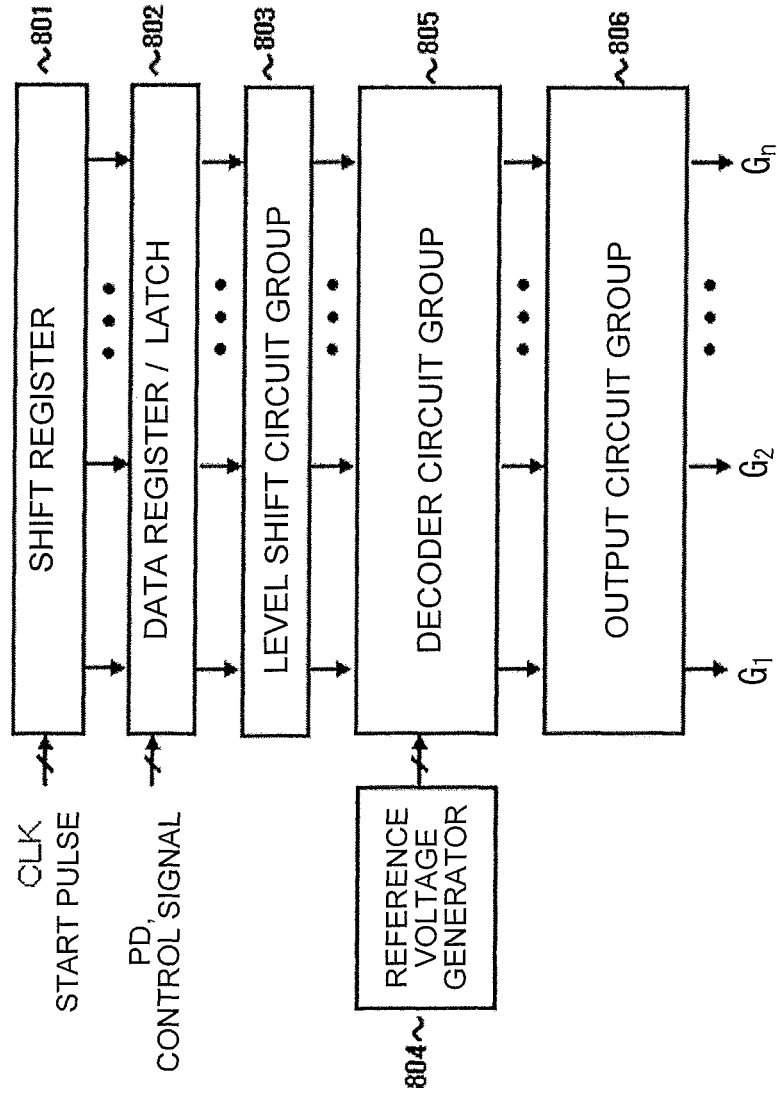
FIG. 18 is a block diagram illustrating the internal configuration of the data driver 80.

FIG. 18 is a block diagram illustrating the internal configuration of the data driver 80. As illustrated in FIG. 18, the data driver 80 includes a shift register 801, data register latches 802, a level change circuit group 803, a reference voltage generation circuit 804, a decoder circuit group 805, and an output circuit group 806.

The shift register 801 generates a plurality of latch timing signals for selecting latches in synchronization with a clock signal CLK in response to a start pulse supplied from the drive controller 65, and supplies the latch timing signals to the data register and latches 802.

The data register and latches 802 capture the pixel data PD supplied from the drive controller 65 on an n-by-n basis on the basis of each of the latch timing signals supplied from the shift register 801, and supplies an n number of pixel data signals each of which represents the pixel data PD of each pixel to the level change circuit group 803.

The level change circuit group 803 applies a level change process to each of the n number of pixel data signals supplied from the data register and latch 802 to increase a signal level, and supplies the obtained n number of level changed pixel data signals to the decoder circuit group 805.

The reference voltage generation circuit 804 generates a plurality of reference voltages having different voltage levels from each other, and supplies the plurality of reference voltages to the decoder circuit group 805.

The decoder circuit group 805 selects an N number of reference voltages that correspond to the n number of respective level changed pixel data signals supplied from the level change circuit group 803 from the above-described plurality of reference voltages, and generates an N number of reference voltage signals representing the selected N number of reference voltages. The decoder circuit group 805 supplies the N number of reference voltage signals that are generated for the n number of respective level changed pixel data signals, that is, an (n×N) number of reference voltage signals to the output circuit group 806.

The output circuit group 806 includes an n number of output circuits corresponding to the n number of data lines $D_1$ to $D_n$ of the display device 20. At this time, each output circuit is constituted of the output circuit described in any of FIGS. 1 to 15.

Each of the n number of output circuits (for example, the output circuit 100_1 illustrated in FIG. 1) included in the output circuit group 806 receives the above-described N number of reference voltage signals as input signal voltages VI_1 to VI_N. Each of the output circuits outputs an output signal voltage VO that is obtained by amplifying the weighted average voltage of the input signal voltages VI_1 to VI_N through the output terminal 2. At this time, the output circuit group 806 outputs the n number of output signal voltages VO outputted from the n number of output circuits as gradation voltage signals $G_1$ to $G_N$ to the data lines $D_1$ to $D_N$ of the display device 20.

Here, the output circuit including the amplification accelerator circuit (200_1 or 200_2), as illustrated in FIGS. 1 to 15, accelerates the charging operation and the discharging operation of each of the data lines $D_1$ to $D_N$ connected to the output terminal 2, by quickly following variations in input signal voltages, thus allowing a high-speed output process.

Thus, by installing the above-described output circuits (100_1 to 100_8), it is possible to provide a data driver that can achieve high quality display capable of increasing the size and resolution of a display panel.

Since each output circuit has an interpolation function that amplifies and outputs the weighted average voltage of the N number of input signal voltages VI_1 to VI_N, the size of the decoder circuit group 805 can be reduced, thus allowing providing a small size data driver.

As described above in detail, the semiconductor device includes the output circuits (100_1 to 100_8) according to the present invention each of which includes the following first to Nth (N is a positive integer of 1 or more) input terminals (1_1 to 1_N), output terminal (2) for outputting an output signal (VO), differential input stages (101_1 or 1012), output amplifier stage (107), and amplification accelerators circuit (200_1 or 200_2).

That is, the differential input stage includes the first conductivity type (N-channel) first to Nth differential stages (11_1 to 11_N), the second conductivity type (P-channel) (N+1)th to (2N)th differential stages (12_1 to 12_N), the first current mirror (30 or 30A), the second current mirror (40 or 40A), the first floating current supply circuit (50), and the second floating current supply circuit (60).

The first conductivity type first to Nth differential stages generate first to Nth pairs of currents, each pair of which corresponds to the difference between each of first to Nth input signals (VI_1 to VI_N) supplied to the first to Nth input terminals and the output signal. One of each of the first to Nth pairs of currents flows into a first common wire (L1), while the other of each of the first to Nth pairs of currents flows into a second common wire (L2).

The second conductivity type (N+1)th to (2N)th differential stages generate (N+1)th to (2N)th pairs of currents, each pair of which corresponds to the difference between each of the first to Nth input signals (VI_1 to VI_N) and the output signal. One of each of the (N+1)th to (2N)th pairs of currents flows into a third common wire (L3), while the other of each of the (N+1)th to (2N)th pairs of currents flows into a fourth wire (L4).

The first current mirror is connected between the first power supply terminal (E1) and first and second nodes (N1 and N2). The first current mirror includes a pair of second conductivity type transistors (131 and 132) the one ends of which are connected to the first and second common wires (L1 and L2), respectively, and the control terminals of which are mutually connected. The first current mirror includes the current input portion (131 and 133), which flows a current into one (131) of the pair of second conductivity type transistors (131 and 132) in accordance with a current flowing through the first common wire (L1) and the second node (N2), and the current output portion (132 and 134), which flows a current into the other (132) of the pair of second conductivity type transistors (131 and 132) in accordance with the current flowing through the one (131) of the pair of second conductivity type transistors (131 and 132).

The second current mirror is connected between the second power supply terminal (E2) and third and fourth nodes (N3 and N4). The second current mirror includes a pair of first conductivity type transistors (141 and 142) the one ends of which are connected to the third and fourth common wires (L3 and L4), respectively, and the control terminals of which are mutually connected. The second current mirror includes the current input portion (141 and 143), which flows a current into one (141) of the pair of first conductivity type transistors (141 and 142) in accordance with a current flowing through the third common wire (L3) and the fourth node (N4), and the current output portion (142 and 144), which flows a current into the other (142) of the pair of first conductivity type transistors (141 and 142) in accordance with the current flowing through the one (141) of the pair of first conductivity type transistors (141 and 142).

The output amplifier stage includes the second conductivity type first output transistor (171), which is connected between the third power supply terminal (E3) and the output terminal and connected to the first node at its control terminal (gate), and the first conductivity type second output transistor (172), which is connected between the fourth power supply terminal (E4) and the output terminal and connected to the third node at its control terminal.

The amplification accelerator circuit includes first and second output nodes (NA and NB) for outputting currents. When the weighted average voltage of the first to Nth input signals, which is determined by a weighting ratio of each of the first to Nth differential stages and the (N+1)th to (2N)th differential stages, is higher than the voltage of the output signal, a current is outputted from the first output node and added to a current flowing through the current output portion of the second current mirror, while the output of a current from the second output node is cut off. On the other hand, when the weighted average voltage of the first to Nth input signals is lower than the voltage of the output signal, a current is outputted from the second output node and added to a current flowing through the current output portion of the first current mirror, while the output of a current from the first output node is cut off. Note that, when the weighted average voltage of the first to Nth input signals is equal to the voltage of the output signal, current outputs from both of the first and second output nodes are cut off.

The semiconductor device including the output circuits (100_1 to 100_8) according to the present invention may be applied to a data driver, which sends out gradation voltage signals each corresponding to the brightness level of each pixel represented by a video signal to a plurality of data lines of a display device. At this time, the data driver includes the following shift register (801), data register and latches (802), level shift circuit group (803), decoder circuit group (805), and output circuit group (806) including the output circuit (100_1 to 100_8) according to the present invention.

That is, the shift register generates latch timing signals on the basis of a start pulse and a clock signal (CLK). The data register and latches latch and output pixel data signals of respective pixels represented by the video signal on a predetermined number basis. The level shift circuit group generates an n number of level changed pixel data signals, by applying a level change process to each of the n number of pixel data signals outputted from the data register and latch to increase a signal level. The decoder circuit group selects an N number of reference voltages that each correspond to each of the level changed pixel data signals from the plurality of reference voltages different from each other, and generates an N number of reference voltage signals corresponding to the selected reference voltages. The output circuit group includes an n number of output circuits corresponding to the n number of data lines of the display device. Each of the output circuits generates an output signal obtained by amplifying a weighted average voltage signal of the N number of reference voltage signals, and outputs the output signal to the corresponding data line of the display device.

A supplemental description will be described as to the amplification accelerator circuits of FIGS. 2 to 4, 6, and 13 to 15 in the above-described embodiments. For example, the amplification accelerator circuit according to each of the above-described embodiments gives an additional operation to the normal differential amplification operation of the output circuit constituted of a differential input stage and an output amplifier stage and is operated during variations in the input signal voltages VI_1 to VI_N, while stopped in the stable output state, as is described with reference to FIGS. 1 and 2 in detail. That is, the amplification accelerator circuit according to each of the above-described embodiments is operated from the time of variations in the input signal voltages to the time immediately before the stable output state. The input signal voltages VI_1 to VI_N are sometimes constituted of a signal group in a sufficiently small voltage range, with respect to the operable voltage range of the output circuit of the present invention. In such a case, all of the input signals for the differential input stage are not necessarily used as the input signals for the amplification accelerator circuit. That is, out of the N number of input signal voltages VI_1 to VI_N for the differential input stage, the weighted average voltage of an M number of input signal voltages, in which M is one or more and N or less, may be compared with the output signal voltage. This allows a reduction in the number of the differential stages constituting the amplification accelerator circuit, thus reducing the size of the output circuit. Such an application is also applicable to the amplification accelerator circuits of FIGS. 2 to 4, 6, and 13 to 15 according to the above-described embodiments.

This application is based on a Japanese Patent Application No. 2016-035475 which is hereby incorporated by reference.

What is claimed is:

1. A semiconductor device comprising:
an output circuit including a differential input stage, an output amplifier stage, first to Nth (N is a positive integer of 1 or more) input terminals, and an output terminal for outputting an output signal, the differential input stage including first to Nth differential stages, (N+1)th to (2N)th differential stages, a first current mirror including a first input node and a first output node, and a second current mirror including a second input node and a second output node; and
an amplification accelerator circuit configured to output first and second currents for accelerating an amplification operation of the output amplifier stage,
wherein when a weighted average voltage of first to Nth input signals supplied to the respective first to Nth input terminals and determined in accordance with a weighting ratio of each of the first to Nth differential stages and the (N+1)th to (2N)th differential stages is higher than a voltage of the output signal, the amplification accelerator circuit adds the outputted first current to a current flowing through said second output node of the second current mirror, while cutting off output of said second current,
when the weighted average voltage is lower than the voltage of the output signal, the amplification accelerator circuit adds the outputted second current to a current flowing through said first output node of the first current mirror, while cutting off output of said first current, and
when the weighted average voltage is equal to the voltage of the output signal, the amplification accelerator circuit cuts off output of both of the first and second currents.

2. The semiconductor device according to claim 1, wherein
the first current mirror includes a pair of first conductivity-type transistors, each having one end connected to the first to Nth differential stages via first and second common wires, respectively, and connected to each other at control terminals,
the first current mirror includes a first current input portion and a first current output portion, the first current input portion flowing a current into one of the pair of first conductivity-type transistors in accordance with a current flowing through the first common wire and the first input node, and the first current output portion flowing a current into the first output node via the other of the pair of first conductivity-type transistors in accordance with the current flowing through the one of the pair of first conductivity-type transistors,
the second current mirror includes a pair of second conductivity-type transistors each having one end connected to the (N+1)th to (2N)th differential stages via third and fourth common wires, respectively, and connected to each other at control terminals, and
the second current mirror includes a second current input portion and a second current output portion, the second current input portion flowing a current into one of the pair of second conductivity-type transistors in accordance with a current flowing through the third common wire and the second input node, and the second current output portion flowing a current into the second output node via the other of the pair of second conductivity-type transistors in accordance with the current flowing through the one of the pair of second conductivity-type transistors.

3. The semiconductor device according to claim 1, wherein
the first to Nth differential stages have second conductivity-type and generate first to Nth pairs of currents each of which corresponds to a difference between each of the first to Nth input signals and the output signal,
the first to Nth differential stages flow one of each of the first to Nth pairs of currents into a first common wire and flow the other of each of the first to Nth pairs of currents into a second common wire,
the (N+1)th to (2N)th differential stages have first conductivity-type and generate (N+1)th to (2N)th pairs of currents each of which corresponds to a difference between each of the first to Nth input signals and the output signal, and the (N+1)th to (2N)th differential stages flow one of each of the (N+1)th to (2N)th pairs of currents into a third common wire and flow the other of each of the (N+1)th to (2N)th pairs of currents into a fourth common wire.

4. The semiconductor device according to claim 2,
a first floating current supply circuit connected between the first input node of the first current mirror and the second input node of the second current mirror, and
a second floating current supply circuit connected between the first output node of the first current mirror and the second output node of the second current mirror.

* * * * *